US012813000B2

(12) United States Patent
Ichino et al.

(10) Patent No.: US 12,813,000 B2
(45) Date of Patent: Nov. 24, 2026

(54) PHOTOELECTRIC CONVERSION APPARATUS, EQUIPMENT, AND LAYERED STRUCTURE FOR AMPLIFYING ELECTRONS SERVING AS SIGNAL CHARGES OUTPUT FROM A PHOTOELECTRIC CONVERSION ELEMENT

(71) Applicant: CANON KABUSHIKI KAISHA, Tokyo (JP)

(72) Inventors: Shinya Ichino, Tokyo (JP); Tsutomu Tange, Kanagawa (JP); Kazuki Ohshitanai, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 625 days.

(21) Appl. No.: 18/342,473

(22) Filed: Jun. 27, 2023

(65) Prior Publication Data

US 2024/0006451 A1 Jan. 4, 2024

(30) Foreign Application Priority Data

Jun. 29, 2022 (JP) ................................. 2022-104633

(51) Int. Cl.
*H10F 39/00* (2025.01)

(52) U.S. Cl.
CPC ....... *H10F 39/809* (2025.01); *H10F 39/8037* (2025.01); *H10F 39/811* (2025.01); *H10F 39/813* (2025.01)

(58) Field of Classification Search
CPC .. H10F 39/809; H10F 39/8037; H10F 39/811; H10F 39/813; H10F 39/18; H10F 39/199
See application file for complete search history.

(56) References Cited

U.S. PATENT DOCUMENTS

| | | | | |
|---|---|---|---|---|
| 2009/0189057 | A1* | 7/2009 | Asaba | H10F 39/18 250/208.1 |
| 2017/0280080 | A1* | 9/2017 | Machida | H10F 99/00 |
| 2018/0114808 | A1* | 4/2018 | Endo | H10F 39/182 |
| 2021/0400224 | A1* | 12/2021 | Gocho | H04N 25/78 |
| 2022/0272295 | A1* | 8/2022 | Kobayashi | H04N 25/766 |

(Continued)

FOREIGN PATENT DOCUMENTS

| | | | |
|---|---|---|---|
| JP | 2005268295 A | * | 9/2005 |
| JP | 2005286168 A | | 10/2005 |
| JP | 2011234366 A | | 11/2011 |

(Continued)

*Primary Examiner* — Ratisha Mehta
*Assistant Examiner* — Sophia W Kao
(74) *Attorney, Agent, or Firm* — Canon U.S.A., Inc. IP Division

(57) ABSTRACT

A photoelectric conversion apparatus includes a first substrate including a photoelectric conversion element, and a second substrate including an amplification transistor and a selection transistor connected electrically to a source of the amplification transistor, the amplification transistor being configured to amplify electrons that are a signal charge output from the photoelectric conversion element. The photoelectric conversion element includes an n-type semiconductor region configured to store the electrons. The amplification transistor and the selection transistor are each a p-type metal oxide semiconductor (p-type MOS) transistor.

18 Claims, 19 Drawing Sheets

(56) References Cited

U.S. PATENT DOCUMENTS

| | | | | |
|---|---|---|---|---|
| 2023/0247325 | A1* | 8/2023 | Zha | H04N 25/573<br>250/206 |
| 2024/0022838 | A1* | 1/2024 | Muto | H04N 25/779 |

FOREIGN PATENT DOCUMENTS

| | | | |
|---|---|---|---|
| JP | 2012015400 | A | 1/2012 |
| JP | 2012019058 | A | 1/2012 |
| JP | 2012079861 | A | 4/2012 |
| JP | 2017005262 | A | 1/2017 |
| JP | 2022092536 | A | 6/2022 |
| WO | 2020080327 | A1 | 4/2020 |

* cited by examiner

PHOTOELECTRIC CONVERSION APPARATUS, EQUIPMENT, AND LAYERED STRUCTURE FOR AMPLIFYING ELECTRONS SERVING AS SIGNAL CHARGES OUTPUT FROM A PHOTOELECTRIC CONVERSION ELEMENT

BACKGROUND

Technical Field

The aspect of the embodiments relates to a photoelectric conversion apparatus, equipment, and a layered structure.

Description of the Related Art

Various pixel structures of photoelectric conversion apparatuses for improving image quality have been discussed. Japanese Patent Application Laid-Open No. 2005-268295 discusses a solid-state image sensor including an amplification transistor formed into a p-type metal oxide semiconductor (PMOS) transistor to reduce 1/f noise. Further, WO 2020/105713 discusses an imaging apparatus with miniaturized pixels in a transistor size by separating a substrate that includes photoelectric conversion elements and a substrate that includes amplification transistors and layering the substrates.

The solid-state image sensor discussed in Japanese Patent Application Laid-Open No. 2005-268295 includes hole storage type photoelectric conversion elements. Thus, the transfer to a floating diffusion (FD) portion takes a longer time compared with electron storage type photoelectric conversion elements, which have high mobility. The solid-state image sensor therefore is not suitable for increasing imaging speed.

SUMMARY

According to an aspect of the embodiments, a photoelectric conversion apparatus includes a first substrate including a photoelectric conversion element, and a second substrate including an amplification transistor and a selection transistor connected electrically to a source of the amplification transistor, the amplification transistor being configured to amplify electrons that are a signal charge output from the photoelectric conversion element. The photoelectric conversion element includes an n-type semiconductor region configured to store the electrons. The amplification transistor and the selection transistor are each a p-type metal oxide semiconductor (p-type MOS) transistor.

Further features of the disclosure will become apparent from the following description of exemplary embodiments with reference to the attached drawings.

DESCRIPTION OF THE EMBODIMENTS

Figure 1:
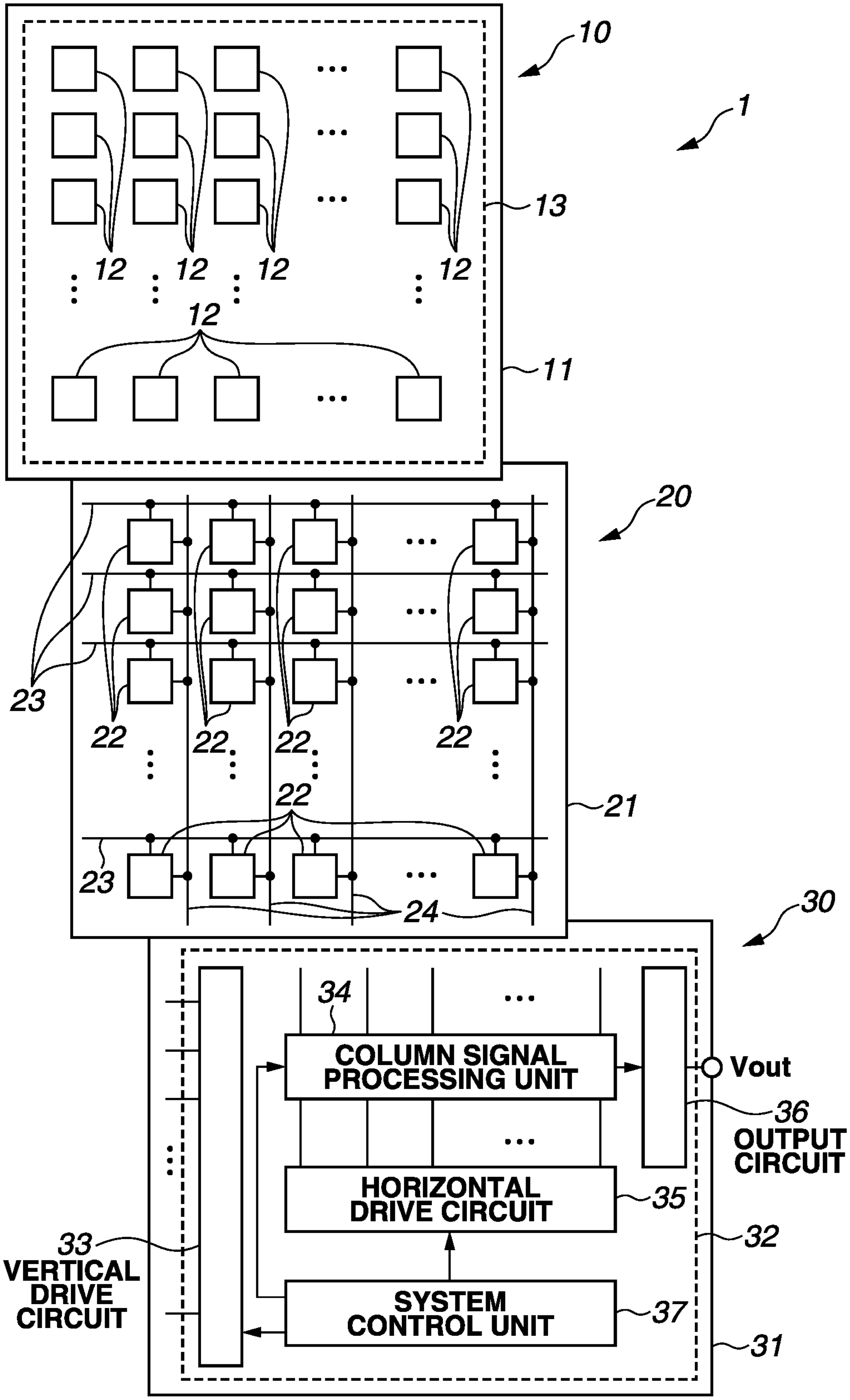
FIG. 1 is a block diagram illustrating a photoelectric conversion apparatus according to exemplary embodiments of the disclosure.

Some exemplary embodiments will be described below with reference to the drawings. The exemplary embodiments described below are not intended to limit the scope of the disclosure. Further, while a plurality of features according to the exemplary embodiments are described below, not all of the plurality of features are used in the disclosure, and the plurality of features can be combined as appropriate. Further, components that correspond to or are similar to each other are given the same reference numeral in the attached drawings, and redundant descriptions thereof are omitted. Further, mainly sensors for imaging will be described below as examples of photoelectric conversion apparatuses according to the exemplary embodiments. Further, the exemplary embodiments are not limited to sensors for imaging and are also applicable to other examples of photoelectric conversion apparatuses, such as imaging apparatuses, distance measurement apparatuses (apparatuses for measuring distances using focal point detection or time-of-flight (TOF)), and photometric apparatuses (apparatuses for measuring an amount of incident light).

In the present specification, terms indicating a specific direction or position (e.g., "above", "below", "right", "left", and other terms including the foregoing terms) are used as appropriate. The terms are used to facilitate understanding of the exemplary embodiments with reference to the drawings and are not intended to limit the technical scope of the disclosure to the meanings of the terms.

Each metal member used for wiring or a pad described in the present specification can be formed of a metal of a single element alone or a mixture (alloy). For example, wiring described as copper wiring can be formed of copper alone or can mainly contain copper and further contain other components. Further, for example, a pad to be connected to an external terminal can be formed of aluminum alone or can mainly contain aluminum and further contain other components. The copper wiring and the aluminum pad described herein are merely examples and can be changed to various metals. Further, the wiring and the pad described herein are merely examples of metal members for use in semiconductor apparatuses and are also applicable to other metal members.

In the present specification, the term "pixel transistor" refers to a transistor that reads signal charges output from photoelectric conversion elements and corresponding to quantities of received light and can be shared by a plurality of photoelectric conversion elements (pixels). For example, the pixel transistors at least include an amplification transistor that amplifies signal charges output from photoelectric conversion elements and outputs the amplified signal charges.

In the present specification, the phrase "members A and B are electrically connected to each other" does not always refer to a case where the members A and B are directly connected to each other. For example, the members A and B can electrically be connected together with another member C connected between the members A and B.

A common structure of the photoelectric conversion apparatuses according to the exemplary embodiments of the disclosure will be described below with reference to FIG. 1.

FIG. 1 is a block diagram illustrating an example of a schematic structure of a photoelectric conversion apparatus 1 applied to each exemplary embodiment.

As illustrated in FIG. 1, the photoelectric conversion apparatus 1 includes three substrates that are a first substrate 10, a second substrate 20, and a third substrate 30. The photoelectric conversion apparatus 1 has a three-dimensional structure formed by sticking the three substrates together. Further, the first substrate 10, the second substrate 20, and the third substrate 30 are layered in this order.

The first substrate 10 includes a first semiconductor member 11. The first semiconductor member 11 includes a plurality of pixels 12, and the plurality of pixels 12 performs photoelectric conversion. The plurality of pixels 12 is arranged in matrix in a pixel region 13 of the first substrate 10. Each of the plurality of pixels 12 includes an electron storage type photoelectric conversion element and outputs pixel signals corresponding to quantities of incident light. Further, each photoelectric conversion element includes an n-type semiconductor region, and the n-type semiconductor regions store electrons.

The second substrate 20 includes a second semiconductor member 21 including reading circuits 22. The reading circuits 22 output pixel signals based on charges output from the pixels 12. Each reading circuit 22 includes a pixel transistor. Further, the second substrate 20 includes a plurality of control lines 23 extending in the row direction and a plurality of vertical output lines 24 extending in the column direction. The control lines 23 are connected to a vertical drive circuit 33 described below. Each of the vertical output lines 24 is connected to the corresponding reading circuits 22 arranged in the column direction and forms a common signal line for the corresponding reading circuits 22. The vertical output lines 24 are connected to a column signal processing unit 34 described below.

The third substrate 30 includes a third semiconductor member 31 including a logic circuit 32. The logic circuit 32 processes pixel signals. The logic circuit 32 includes, for example, the vertical drive circuit 33, the column signal processing unit 34, a horizontal drive circuit 35, an output circuit 36, and a system control unit 37.

The vertical drive circuit 33 is a control circuit that has a function of receiving control signals supplied from the system control unit 37, generating control signals for driving the pixels 12 and the reading circuits 22, and supplying the generated control signals to the pixels 12 and the reading circuits 22 via the control lines 23. Signals that are read in units of rows from the reading circuits 22 are input to the column signal processing unit 34 via the vertical output lines 24.

The column signal processing unit 34 includes a plurality of column circuits. Each column circuit is provided to correspond to one of the vertical output lines 24 and includes a processing circuit and a signal holding circuit. Each processing circuit has a function of performing predetermined signal processing on pixel signals output via the corresponding vertical output line 24. Examples of signal processing that the processing circuits perform include amplification processing, correction processing using correlated double sampling (CDS), and analog/digital (AD) conversion processing. Each signal holding circuit has a function as a memory for holding pixel signals processed by the corresponding processing circuit.

The horizontal drive circuit 35 is a control circuit that has a function of receiving control signals supplied from the system control unit 37, generating control signals for reading pixel signals from the column signal processing unit 34, and supplying the generated control signals to the column signal processing unit 34. The horizontal drive circuit 35 sequentially scans the column circuits of each column of the column signal processing unit 34 and outputs pixel signals held by the column circuits to the output circuit 36.

The output circuit 36 is a circuit that includes an external interface circuit and outputs signals processed by the column signal processing unit 34 to the outside of the photoelectric conversion apparatus 1. The external interface circuit of the output circuit 36 is not particularly limited.

The system control unit 37 is a control circuit that generates control signals for controlling the vertical drive circuit 33, the column signal processing unit 34, and the horizontal drive circuit 35 and supplies the generated control signals to the functional blocks.

The schematic structure of the photoelectric conversion apparatus 1 including the three substrates layered three-dimensionally as illustrated in FIG. 1 is a basic structure according to the exemplary embodiments of the disclosure. A substrate with photoelectric conversion elements formed thereon and another substrate with pixel transistors formed thereon are separately formed and then layered. This makes it possible to have space for arranging the pixel transistors even at reduced pixel pitches. Thus, the structure is a suitable structure of a photoelectric conversion apparatus for miniaturization.

The schematic structure of the photoelectric conversion apparatus 1 is applicable to the exemplary embodiments described below.

A structure of the photoelectric conversion apparatus 1 according to a first exemplary embodiment of the disclosure will be described with reference to FIGS. 2 to 11. Each component corresponding to a component in FIG. 1 is given the same reference numeral as the corresponding component, and redundant descriptions thereof are omitted or simplified in some cases. Further, a schematic structure of the photoelectric conversion apparatus 1 according to the present exemplary embodiment is as illustrated in FIG. 1.

The photoelectric conversion apparatus 1 having the schematic structure illustrated in FIG. 1 will now be described, focusing on characteristics according to the present exemplary embodiment.

Figure 2:
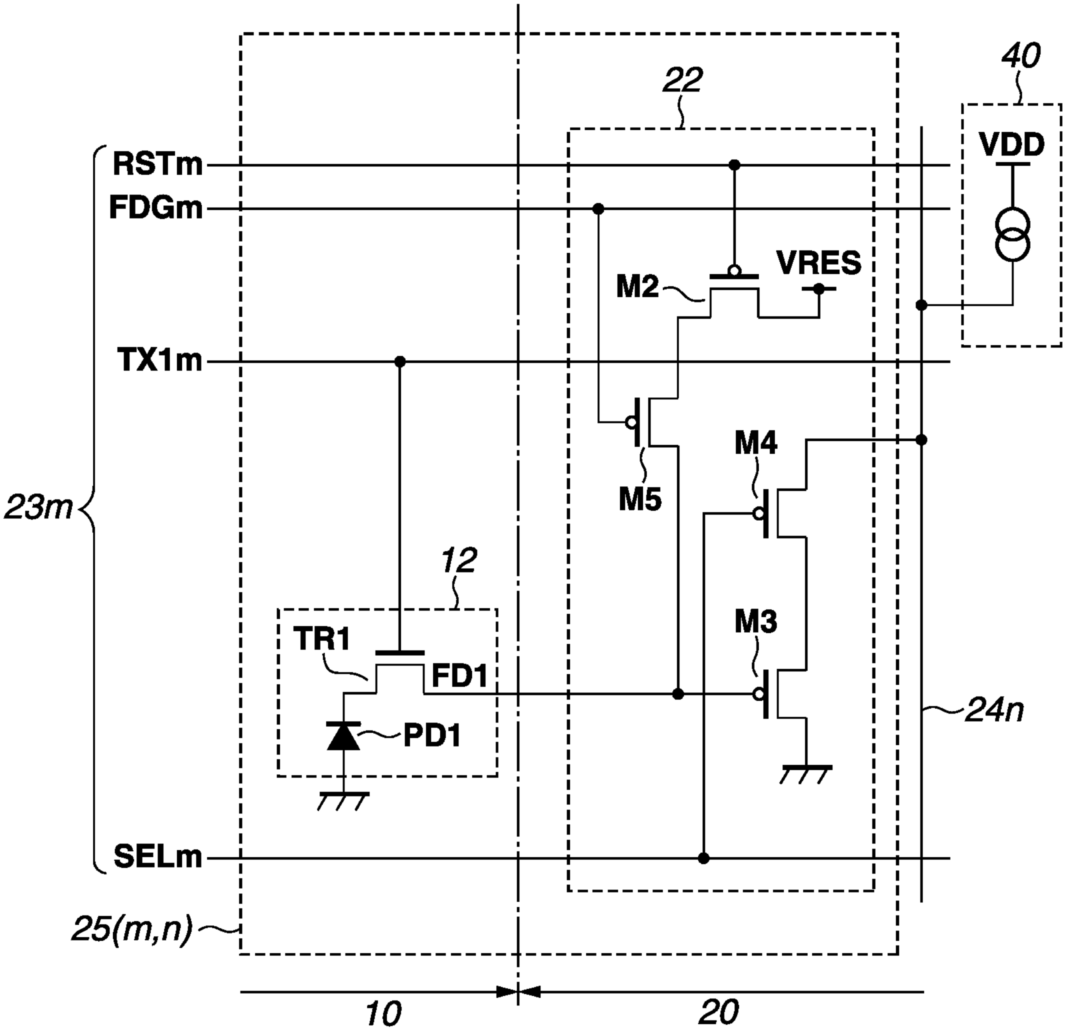
FIG. 2 is a circuit diagram illustrating a photoelectric conversion apparatus according to a first exemplary embodiment.
Figure 3:
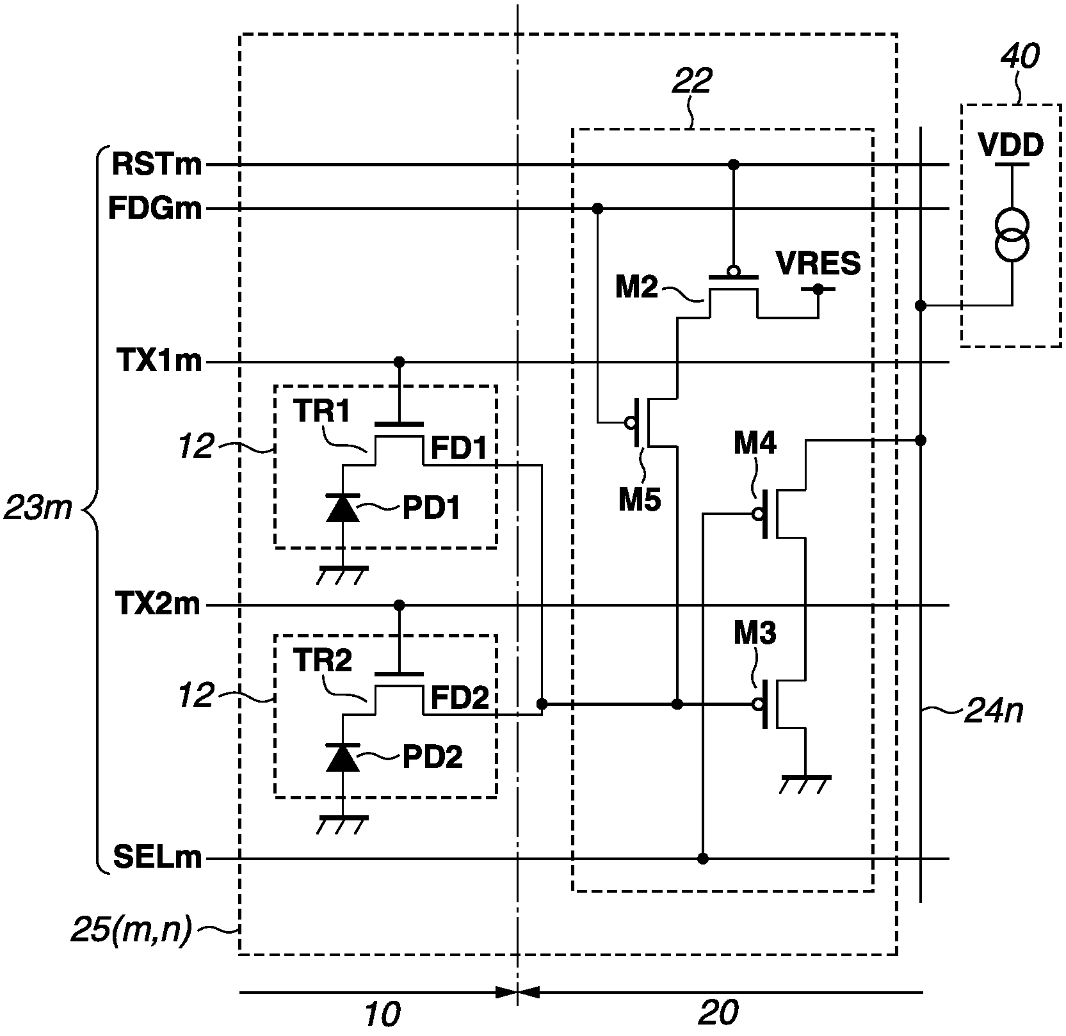
FIG. 3 is a circuit diagram illustrating a photoelectric conversion apparatus according to the first exemplary embodiment.
Figure 4:
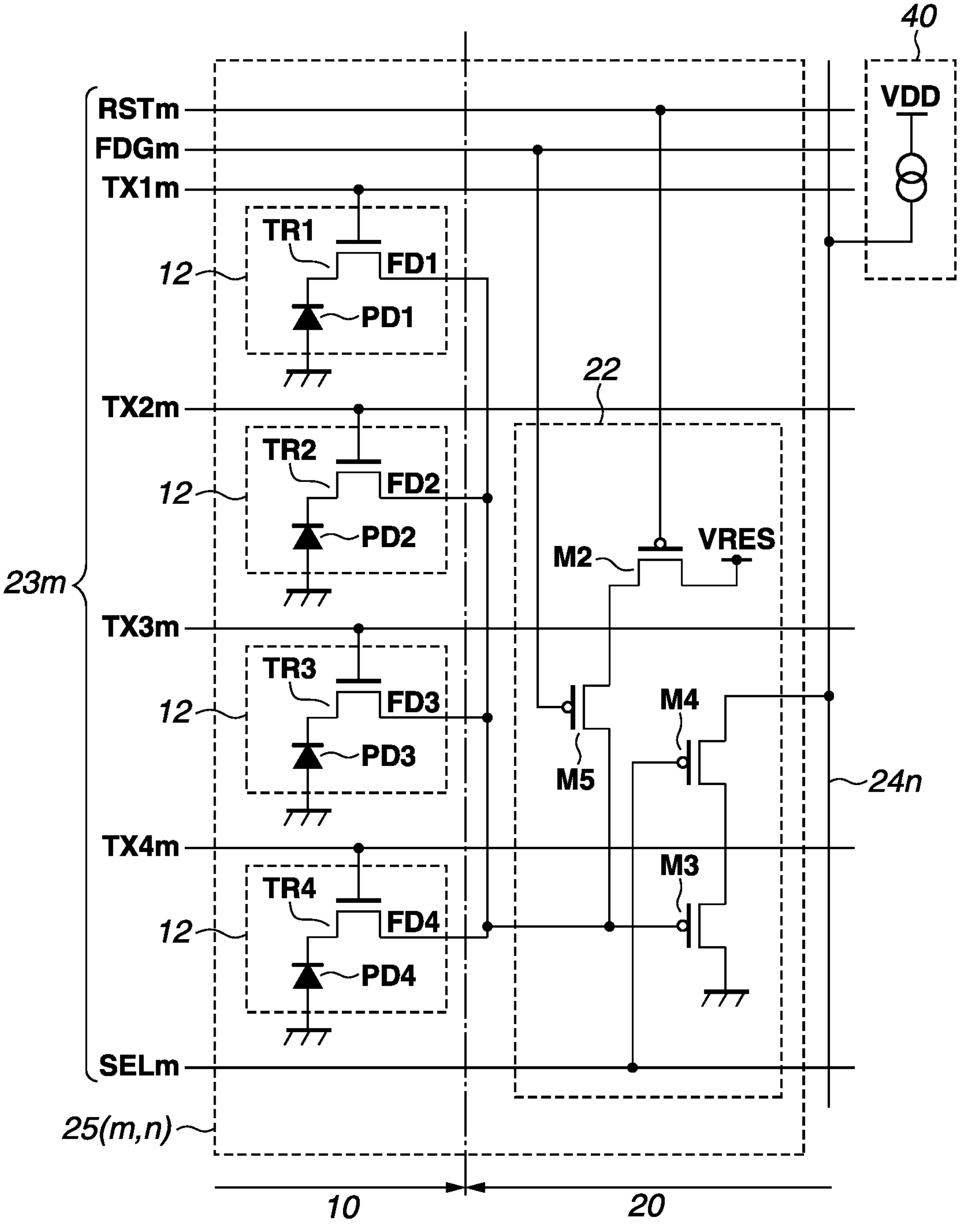
FIG. 4 is a circuit diagram illustrating a photoelectric conversion apparatus according to the first exemplary embodiment.

FIGS. 2 to 4 are examples of circuit diagrams illustrating the pixels 12 and the reading circuits 22 according to the present exemplary embodiment. FIG. 2 is a circuit diagram illustrating a case where outputs of one pixel 12 are input to one reading circuit 22. In another case, the plurality of pixels 12 shares one reading circuit 22. The number of pixels 12 connected to one reading circuit 22 is changeable to any number.

More specifically, a case where two pixels 12 share one reading circuit 22 is illustrated in FIG. 3, and a case where four pixels 12 share one reading circuit 22 is illustrated in FIG. 4. As used herein, the term "share" indicates that outputs of the plurality of pixels 12 are input to the reading circuit 22 shared by the plurality of pixels 12.

The pixels 12 illustrated in FIGS. 2 to 4 include components common to the pixels 12. Thus, in order to distinguish between the common components of the pixels 12, an identification number (1, 2, 3, 4) is added at each end of reference numbers of the components of the pixels 12. Hereinafter, when the common components of the pixels 12 are distinguished from each other, the identification numbers are added at the ends of the reference numerals of the components of the pixels 12. On the other hand, when the common components of the pixels 12 are not distinguished from each other, no identification numbers are added at the ends of the reference numerals of the components of the pixels 12.

Details will be described with reference to FIG. 2 illustrating the simplest circuit structure.

Hereinafter, each set of a predetermined number of pixels 12 connected to one reading circuit 22 will be referred to as "unit pixel 25". FIG. 2 illustrates a unit pixel 25(*m, n*) of the mth row and the nth column that is extracted from the plurality of unit pixels 25, where m is an integer of 1 to M and n is an integer of 1 to N. The unit pixels 25 excluding the unit pixel 25(*m, n*) each have the same circuit structure as the circuit structure of the unit pixel 25(*m, n*).

As illustrated in FIG. 2, the unit pixel 25(*m, n*) includes a photoelectric conversion element PD1, a floating diffusion portion FD1, a transfer transistor TR1, a reset transistor M2, and an amplification transistor M3. The unit pixel 25(*m, n*) further includes a selection transistor M4 and a floating diffusion (FD) capacitance switching transistor M5. There are cases where no FD capacitance switching transistor M5 is provided. Details thereof will be described below. Further, there are cases where no selection transistor M4 is provided.

Further, for example, in FIG. 2, the reset transistor M2, the amplification transistor M3, the selection transistor M4, and the FD capacitance switching transistor M5 each correspond to "pixel transistor". Further, the transfer transistor TR1 transfers, to the amplification transistor M3, electrons that are signal charges output from the photoelectric conversion element PD1. Further, the amplification transistor M3 amplifies electrons that are signal charges output from the photoelectric conversion element PD1.

The photoelectric conversion element PD1 is, for example, a photodiode. The anode of the photoelectric conversion element PD1 is connected to a reference voltage node, and the cathode of the photoelectric conversion element PD1 is connected to the source of the transfer transistor TR1. The drain of the transfer transistor TR1 is connected to the drain of the FD capacitance switching transistor M5 and the gate of the amplification transistor M3. Further, the second substrate 20 includes a node to which the drain of the transfer transistor TR1, the drain of the FD capacitance switching transistor M5, and the gate of the amplification transistor M3 are connected. The floating diffusion portion FD1 includes part of capacitance components (FD capacitance) and has a function as a charge holding portion. The FD capacitance includes parasitic capacitances of the floating diffusion portion FD1 and an electrically path from the floating diffusion portion FD1 to the gate of the amplification transistor M3. The source of the FD capacitance switching transistor M5 is connected to the drain of the reset transistor M2. The source of the reset transistor M2 is connected to a node VRES. A voltage in a range greater than a reference voltage GND and smaller than a power supply voltage VDD (first power supply voltage) is settable to the node VRES based on a reset operation of the photoelectric conversion element PD1 and the floating diffusion portion FD1. However, a settable voltage range of the node VRES is limited, which will be described below. The drain of the amplification transistor M3 is connected to the reference voltage node. The reference voltage node herein is set to the ground potential as an example. The source of the amplification transistor M3 is connected to the drain of the selection transistor M4. The source of the selection transistor M4 is connected to the vertical output line 24*n*. Further, a column current source 40 is connected to the vertical output line 24*n*.

The first substrate 10 includes the photoelectric conversion element PD1, the transfer transistor TR1, and the floating diffusion portion FD1, and the second substrate 20 includes the reset transistor M2, the amplification transistor M3, the selection transistor M4, and the FD capacitance switching transistor M5. Further, the third substrate 30 includes the column current source 40.

The sources and drains of metal oxide semiconductor (MOS) transistors may be called differently depending on the conductivity type and a focused function of a transistor. Some or all of the sources and drains used herein as names according to the present exemplary embodiment may be referred to sometimes as the opposite terms.

Each photoelectric conversion element PD according to the present exemplary embodiment is formed of an electron storage type photodiode that uses electrons as signal charges from pairs of electrons and holes generated by light incidence. Electrons as carriers are higher in mobility than holes in electron storage type photodiodes, and stored charges therefore are transferred to the floating diffusion portion FD at a higher transfer speed compared with hole storage type photodiodes. Thus, the structure may be beneficial in performing high-speed imaging. Further, each transfer transistor TR is formed of an n-type MOS (NMOS) transistor suitable for the transfer in electron storage type photodiodes.

On the other hand, the pixel transistors according to the present exemplary embodiment are formed of p-type MOS (PMOS) transistors. It is known that 1/f noise in PMOS is one to two digits smaller than 1/f noise in NMOS. Further, it is known that random telegraph signal (RTS) noise is smaller in a PMOS source-follower circuit as described below than a NMOS source-follower circuit. Furthermore, according to the present exemplary embodiment, the gates of the pixel transistors contain p-type polysilicon.

As described above, especially forming the PMOS amplification transistor M3 can be effective to reduce noise generated in the reading circuits 22. As described above, with the reading circuits 22 having a PMOS structure that generates relatively small noise, 1/f noise and RTS noise generated in the reading circuits 22 are effectively reduced without increasing the gate size of the pixel transistors or increasing the gate oxide film capacitance.

In the circuit structure illustrated in FIG. 2, the control line 23*m* in the row includes four signal lines connected to the gate of the transfer transistor TR1, the gate of the reset transistor M2, the gate of the selection transistor M4, and the gate of the FD capacitance switching transistor M5. A control signal TX1*m* is supplied from the vertical drive circuit 33 to the gate of the transfer transistor TR1 of the unit pixel 25 in the mth row. A control signal RSTm is supplied from the vertical drive circuit 33 to the gate of the reset transistor M2 of the unit pixel 25 in the mth row. A control signal SELm is supplied from the vertical drive circuit 33 to the gate of the selection transistor M4 of the unit pixel 25 in the mth row. A control signal FDGm is supplied from the vertical drive circuit 33 to the gate of the FD capacitance switching transistor M5 of the unit pixel 25 in the mth row.

The photoelectric conversion element PD1 converts incident light into charges in an amount corresponding to the quantity of the incident light (photoelectric conversion) and stores the generated charges. With the transfer transistor TR1 turned on, the transfer transistor TR1 transfers charges Q of signal charges held by the photoelectric conversion element PD1 to the floating diffusion portion FD1. The charges Q transferred from the photoelectric conversion element PD1 are held by the FD capacitance. Consequently, the floating diffusion portion FD1 is changed to a voltage V corresponding to the amount of the charges transferred from the photoelectric conversion element PD1 by charge/voltage conversion based on Q=CV, where C is the FD capacitance.

The FD capacitance switching transistor M5 is used in changing a capacitance value of the FD capacitance. In general, pixel signals in imaging in dark places are small. When the FD capacitance is high in performing charge/voltage conversion, the voltage V converted by the amplification transistor M3 becomes small. In bright places, pixel signals increase, so that the charges of the photoelectric conversion element PD1 level off at the floating diffusion portion FD1 unless the FD capacitance is high. Furthermore, the FD capacitance is increased to prevent the voltage V converted by the amplification transistor M3 from increasing excessively.

Thus, with the FD capacitance switching transistor M5 turned on, a gate capacitance corresponding to the FD capacitance switching transistor M5 is added, so that the entire FD capacitance increases. On the other hand, with the FD capacitance switching transistor M5 turned off, the entire FD capacitance decreases. Turning on/off the FD capacitance switching transistor M5 as described above changes the capacitance value of the FD capacitance, switching the conversion efficiency. In an alternative structure, the reading circuits 22 do not include the FD capacitance switching transistor M5, and the drain of the reset transistor M2 is connected to the floating diffusion portion FD1.

When the selection transistor M4 is turned on, the amplification transistor M3 is connected to the vertical output line 24*n*. The drain of the amplification transistor M3 is connected to a reference potential GND, and a bias current is supplied from the column current source 40 to the source of the amplification transistor M3 via the selection transistor M4, forming an amplification portion (source-follower circuit) with the gate of the amplification transistor M3 as an input node. With this structure, the amplification transistor M3 outputs a signal based on a voltage of the floating diffusion portion FD1 to the vertical output line 24*n* via the selection transistor M4. In this sense, the amplification transistor M3 and the selection transistor M4 are an output portion that outputs pixel signals based on amounts of charges held by the floating diffusion portion FD1.

The reset transistor M2 has a function of controlling the supply of a voltage VRES (second power supply voltage) for resetting the floating diffusion portion FD1 as a charge holding portion to the floating diffusion portion FD1.

With the reset transistor M2 turned on, the reset transistor M2 resets the floating diffusion portion FD1 to a voltage corresponding to the voltage VRES (second power supply voltage). At this time, turning on the transfer transistor TR1 simultaneously allows the photoelectric conversion element PD1 to be reset to a voltage corresponding to the voltage VRES (second power supply voltage).

The voltage VRES (second power supply voltage) is settable to a voltage in a range greater than the reference voltage GND and smaller than the power supply voltage VDD (first power supply voltage). Specifically, the voltage VRES (second power supply voltage) supplied to the reset transistor M2 is greater than the reference voltage GND and smaller than the power supply voltage VDD (first power supply voltage). Adjustments are to be made as appropriate so that a voltage variation range of the floating diffusion portion FD1 with respect to light incidence on the photoelectric conversion element PD1 falls within a linear response range of the source-follower circuit formed by the amplification transistor M3 and the column current source 40. In other words, the voltage VRES (second power supply voltage) is to be set so that a MOS (PMOS is assumed herein) transistor to be a constant current load of the column current source 40 included in the source-follower circuit constantly drives in a level-off region regardless of the level of light incidence on the photoelectric conversion element PD1. Specifically, the closer the voltage VRES (second power supply voltage) is to the power supply voltage VDD (first power supply voltage), the more difficult the operation of the column current source 40 becomes in imaging a dark place where pixel signals are small, so that linear response characteristics to light incidence may not be maintained. Thus, the voltage VRES (second power supply voltage) is set to an appropriate voltage accordingly. The power supply voltage VDD (first power supply voltage) supplied to the amplification transistor M3 and the node VRES (second power supply voltage) supplied to the reset transistor M2 are different from each other.

Further, when the voltage VRES (second power supply voltage) is decreased from the power supply voltage VDD (first power supply voltage), a reset voltage of the photoelectric conversion element PD1 can decrease. Thus, an appropriate negative bias is applied to the anode (connected to a reference potential in FIG. 2) of the photoelectric conversion element PD1. This makes it possible to perform a reset operation equivalent to the resetting with the power supply voltage VDD (first power supply voltage) even when the voltage VRES (second power supply voltage) is decreased from the power supply voltage VDD (first power supply voltage).

As described above, controlling the pixel transistors suitably enables signals corresponding to reset voltages of the floating diffusion portions FD and signals corresponding to quantities of light incident on the photoelectric conversion elements PD to be read from the unit pixels 25.

Figure 5:
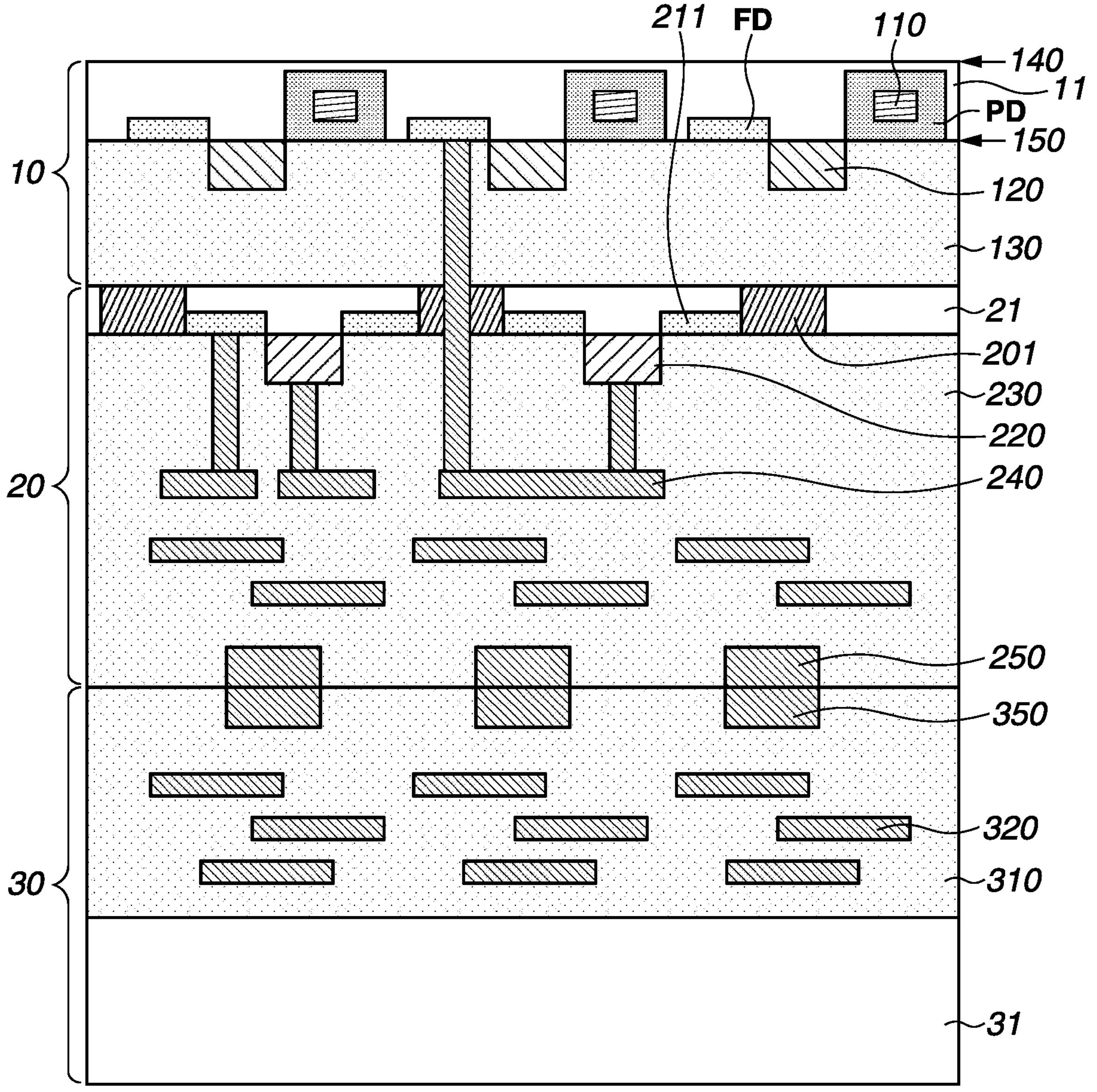
FIG. 5 is a cross-sectional view illustrating a photoelectric conversion apparatus according to the first exemplary embodiment.

FIG. 5 is an example of a cross-sectional view corresponding to one unit pixel 25 of the photoelectric conversion apparatus 1 according to the present exemplary embodiment.

As illustrated in FIG. 5, the photoelectric conversion apparatus 1 according to the present exemplary embodiment includes the first substrate 10, the second substrate 20, and the third substrate 30. The first substrate 10, the second substrate 20, and the third substrate 30 are layered in order.

The first substrate 10 includes the first semiconductor member 11 and a first insulation film 130. The photoelectric conversion elements PD and the floating diffusion portions FD are arranged in the first semiconductor member 11. Each photoelectric conversion element PD includes an n-type semiconductor region 110. Further, gates 120 of the transfer transistors TR are arranged in the first insulation film 130.

The second substrate 20 includes the second semiconductor member 21 and a second insulation film 230. First source/drain regions 211 of the pixel transistors are arranged in the second semiconductor member 21. Further, first gates 220 of the pixel transistors and wiring structures 240 and 250 are arranged in the second insulation film 230. Further, element isolation regions 201 may be arranged in the second semiconductor member 21.

The third substrate 30 includes the third semiconductor member 31 and a third insulation film 310. The MOS transistors including gates are arranged in the third semiconductor member 31, and a predetermined signal processing unit, such as an AD conversion circuit portion and the column current source 40, is arrangeable in the third semiconductor member 31. Further, wiring structures 320 and 350 are arranged in the third insulation film 310.

The first substrate 10, the second substrate 20, and the third substrate 30 are electrically connectable to each other via the wiring structures 240, 250, 320, and 350 arranged in the first insulation film 130, the second semiconductor member 21, the second insulation film 230, and the third insulation film 310. Further, the wiring structures 250 and 350 are layered facing each other, and the second insulation film 230 and the third insulation film 310 are layered facing each other. The wiring structures 250 and 350 are electrically connected to each other. The wiring structures 240 penetrating through a depth position of the second substrate 20 are electrically connected to the floating diffusion portions FD. Furthermore, the wiring structures 240 are electrically connected to the first gates 220.

The first semiconductor member 11 includes a first surface 140 and a second surface 150, and the first surface 140 is a light receiving surface. The first semiconductor member 11, the first insulation film 130, the second semiconductor member 21, the second insulation film 230, the third insulation film 310, and the third semiconductor member 31 are layered in the order in the direction from the first surface 140 toward the second surface 150.

Further, an optical structure (not illustrated), such as an in-layer lens, a color filter layer, and a microlens, is arrangeable in the order from the first surface 140 side on the first semiconductor member 11.

As indicated above, the photoelectric conversion apparatus 1 according to the present exemplary embodiment is a layered sensor and is also a back-illuminated sensor.

A method for fabricating a photoelectric conversion apparatus according to the present exemplary embodiment will now be described with reference to FIGS. 6 to 11. FIGS. 6 to 11 are examples of cross-sectional views illustrating processes illustrating the method for fabricating a photoelectric conversion apparatus according to the present exemplary embodiment.

Figure 6:
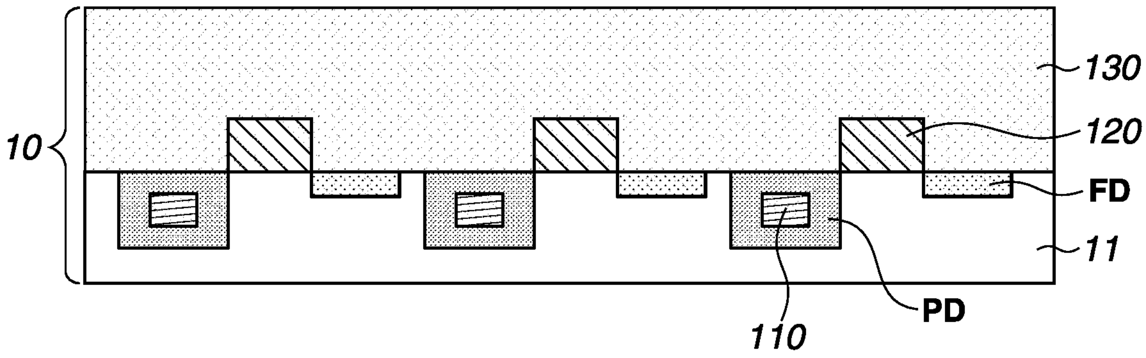
FIG. 6 is a cross-sectional view illustrating a method for fabricating a photoelectric conversion apparatus according to the first exemplary embodiment.

First, as illustrated in FIG. 6, the photoelectric conversion elements PD and the floating diffusion portions FD are formed in the first semiconductor member 11. Further, element isolation regions (not illustrated) may also be formed in the first semiconductor member 11.

The n-type semiconductor regions 110 are formed inside the photoelectric conversion elements PD. Further, each floating diffusion portion FD includes an n-type semiconductor region. Further, the gates 120 of the transfer transistors TR are formed on the second surface 150. The gates 120 are formed of n-type polysilicon. The n-type polysilicon can be formed by, for example, introducing a dopant gas during film formation using a low-pressure chemical vapor deposition (low-pressure CVD) method. Further, the n-type polysilicon can be formed also by implanting an n-type impurity using an ion implantation method after a polysilicon film is formed. Thereafter, the first insulation film 130 is formed on the second surface 150. The first semiconductor member 11 is, for example, a silicon substrate.

Figure 7:
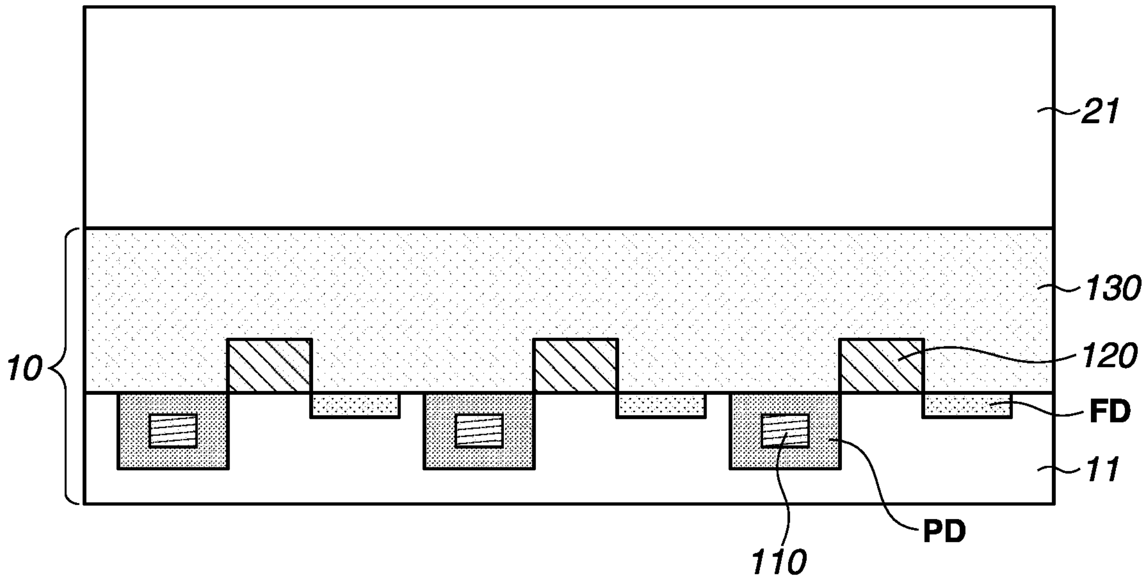
FIG. 7 is a cross-sectional view illustrating a method for fabricating a photoelectric conversion apparatus according to the first exemplary embodiment.

Next, as illustrated in FIG. 7, the second semiconductor member 21 is arranged on the first insulation film 130. For example, the first semiconductor member 11 and the second semiconductor member 21 can be bonded together via the first insulation film 130, which is a silicon oxide film.

Figure 8:
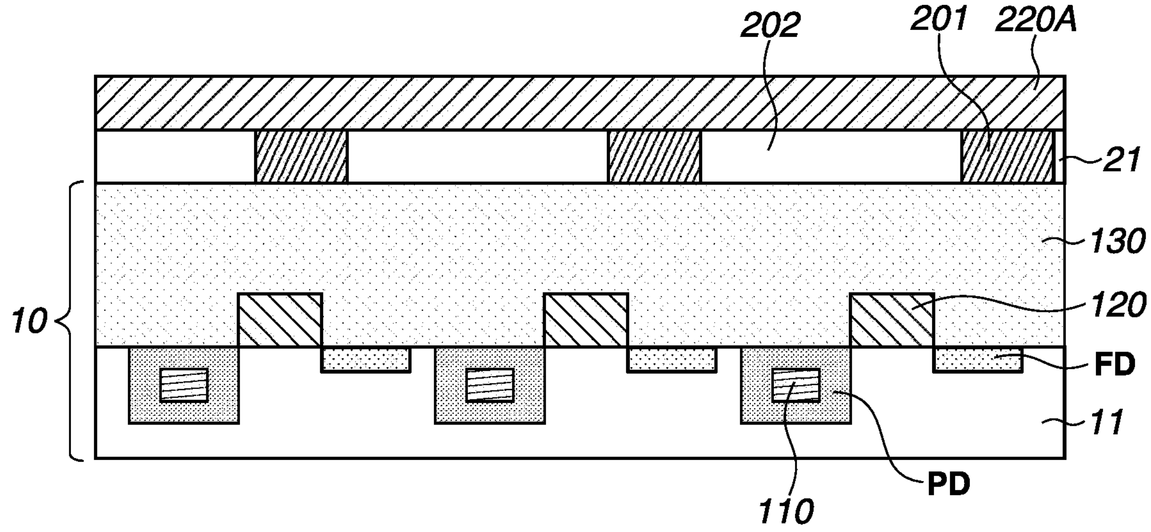
FIG. 8 is a cross-sectional view illustrating a method for fabricating a photoelectric conversion apparatus according to the first exemplary embodiment.

Thereafter, as illustrated in FIG. 8, the second semiconductor member 21 is thinned. Further, the element isolation regions 201 and first well regions 202 are formed in the second semiconductor member 21. The first well regions 202 are electrically isolated by the element isolation regions 201. Each first well region 202 includes an n-type semiconductor region.

Thereafter, a p-type first polysilicon layer 220A for forming the gates of the pixel transistors is formed over the second semiconductor member 21. The p-type polysilicon can be formed by, for example, introducing a dopant gas during film formation using a low-pressure CVD method. Further, the p-type polysilicon can be formed also by implanting a p-type impurity using an ion implantation method after a polysilicon film is formed.

Figure 9:
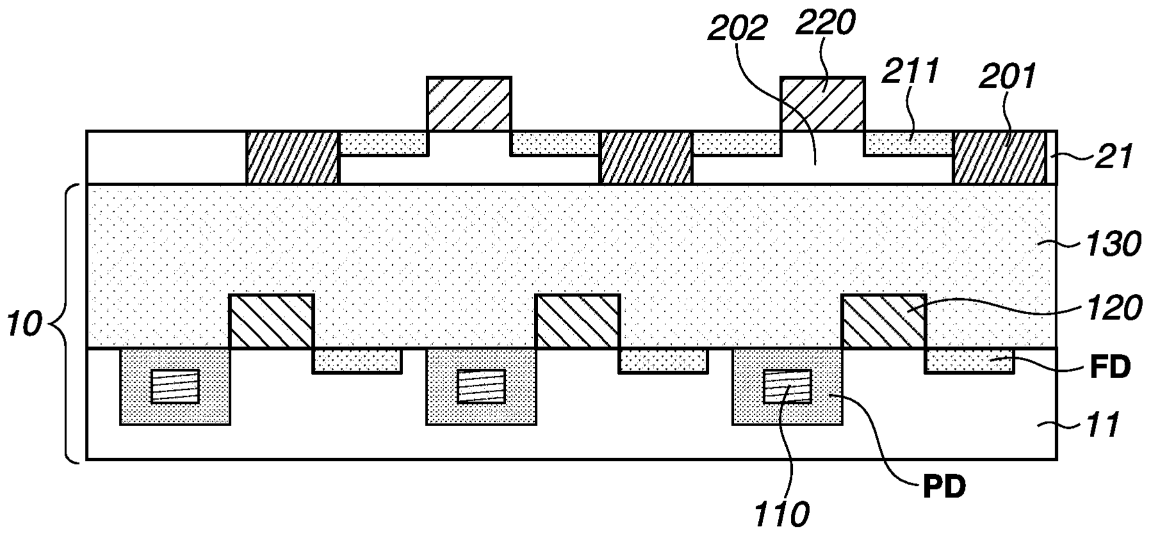
FIG. 9 is a cross-sectional view illustrating a method for fabricating a photoelectric conversion apparatus according to the first exemplary embodiment.

Next, as illustrated in FIG. 9, the first gates 220 of the transistors are formed on the second semiconductor member 21 using a photolithography technique and an etching technique. Then, after the first gates 220 are formed, the p-type first source/drain regions 211 are formed in the second semiconductor member 21 using an ion implantation technique. Consequently, p-type pixel transistors including the first gates 220 containing p-type polysilicon are formed. Specifically, the reset transistor M2, the amplification transistor M3, the selection transistor M4, and the FD capacitance switching transistor M5 for driving the photoelectric conversion elements PD and the floating diffusion portions FD formed in the first semiconductor member 11 are formed in the second semiconductor member 21.

Figure 10:
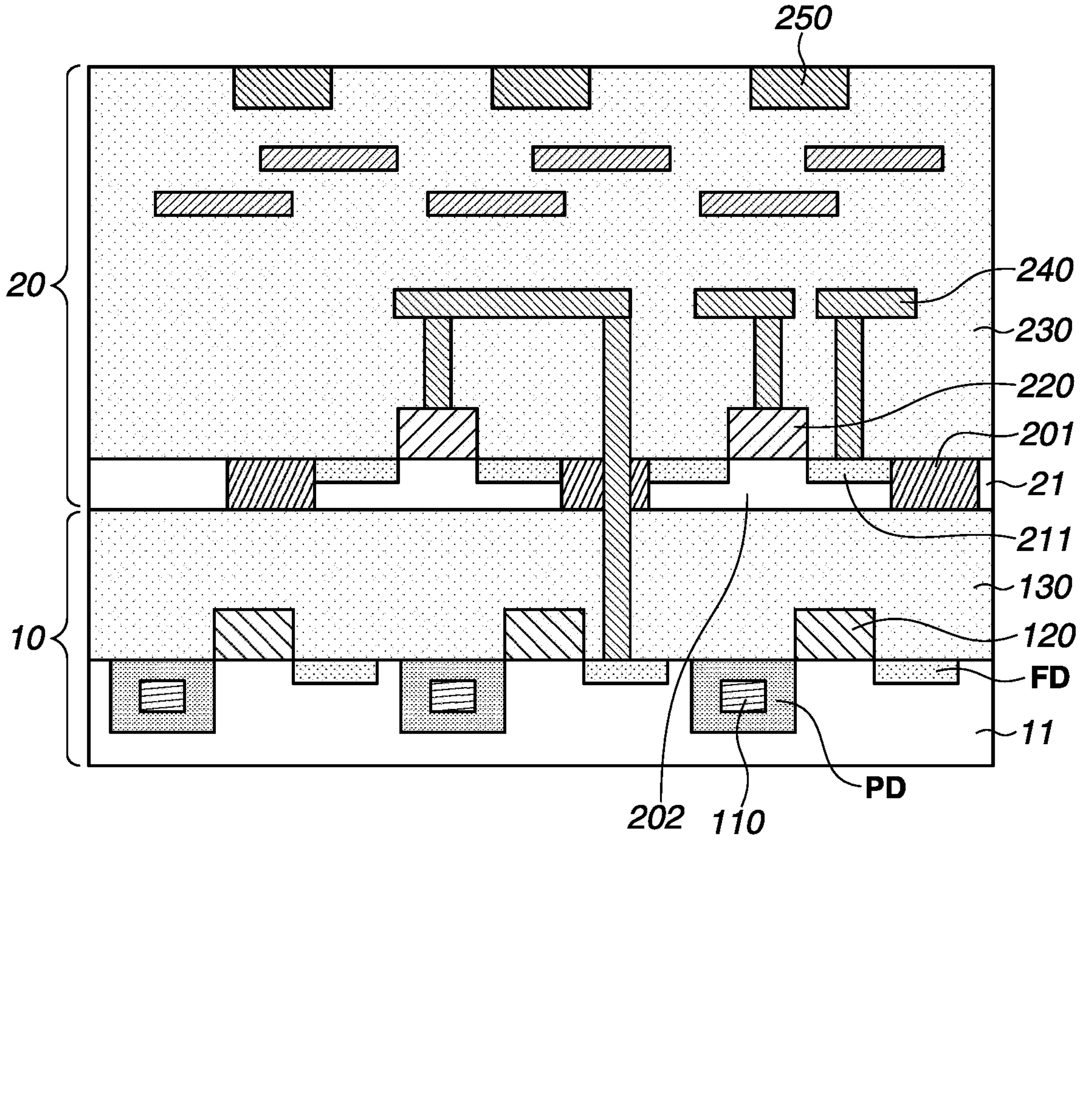
FIG. 10 is a cross-sectional view illustrating a method for fabricating a photoelectric conversion apparatus according to the first exemplary embodiment.

Further, after the pixel transistors are formed, the second insulation film 230 is formed over the second semiconductor member 21 as illustrated in FIG. 10. Thereafter, the wiring structures 240 and 250 are formed in the second insulation film 230. The wiring structures 240 are formed to penetrate through the depth position of the second substrate 20. Further, the wiring structures 240 are electrically connected to the floating diffusion portions FD and the first gates 220. Specifically, the first semiconductor member 11 and the second semiconductor member 21 are electrically connected to each other via the wiring structures 240.

Methods for forming the pixel transistors in the second semiconductor member 21 are not limited to a method in which the pixel transistors are formed in the second semiconductor member 21 after the first semiconductor member 11 and the second semiconductor member 21 are layered. After the pixel transistors are formed in advance in the second semiconductor member 21, the first semiconductor member 11 and the second semiconductor member 21 can be bonded together. The structure illustrated in FIG. 10 can be a layered structure including the first substrate 10 and the second substrate 20.

Figure 11:
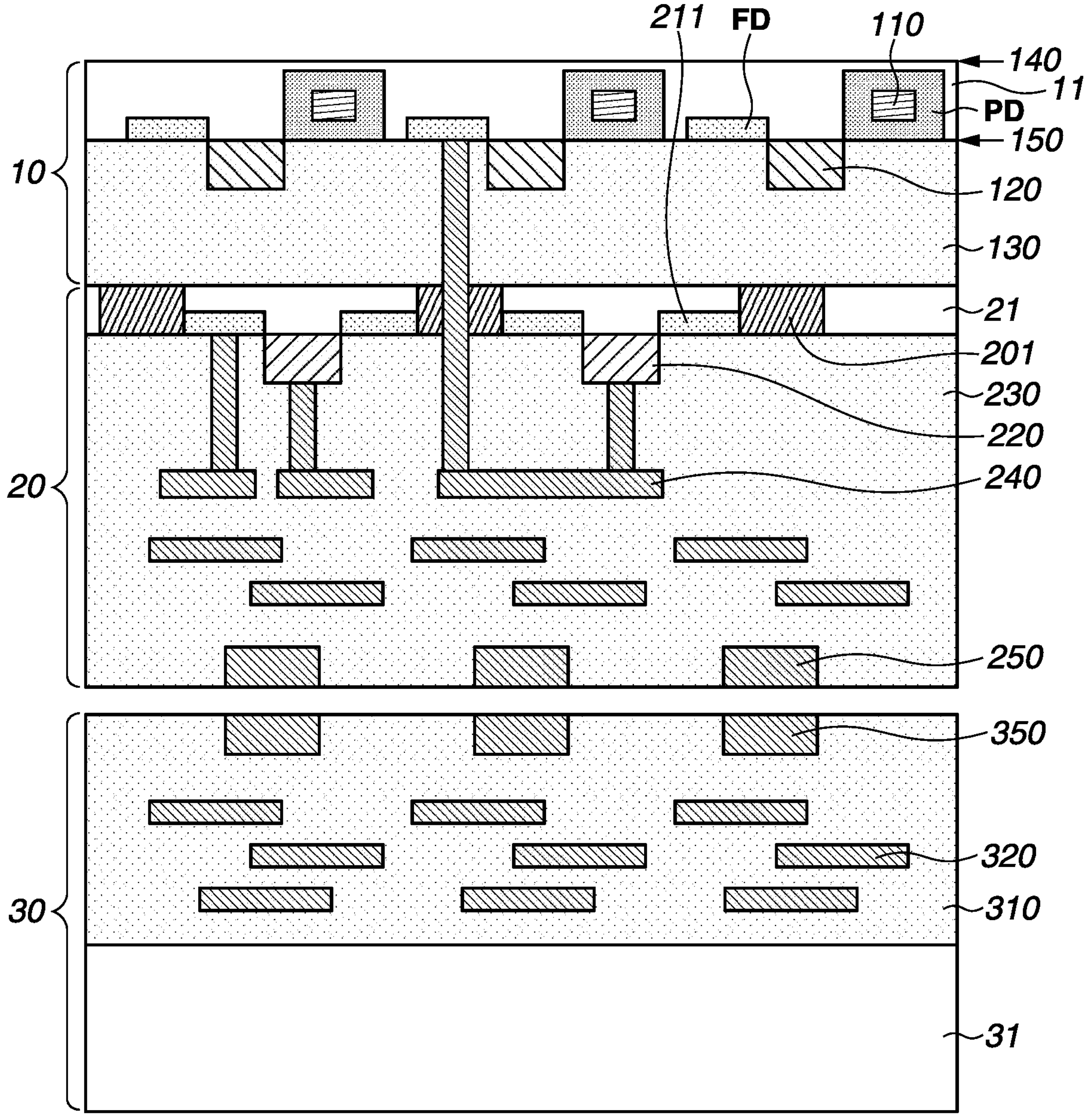
FIG. 11 is a cross-sectional view illustrating a method for fabricating a photoelectric conversion apparatus according to the first exemplary embodiment.

Thereafter, as illustrated in FIG. 11, the third substrate 30 with the third insulation film 310 and the wiring structures 320 and 350 formed on or above the third semiconductor member 31 is layered over the second substrate 20. Specifically, the third substrate 30 is layered over the layered structure including the first substrate 10 and the second substrate 20. The second substrate 20 and the third substrate 30 are layered so that the wiring structures 250 and 350 face each other and the second insulation film 230 and the third insulation film 310 face each other, and the wiring structures 250 and 350 are electrically connected to each other. For example, the wiring structures 250 and 350 contain a conductive material containing Cu as a main component, and the second insulation film 230 and the third insulation film 310 each include a silicon oxide film. Thus, the second substrate 20 and the third substrate 30 can be bonded together by Cu—Cu metallic bonding and covalent bonding of the silicon oxide films. The second insulation film 230 and the third insulation film 310 are not limited to a silicon oxide film and can be formed by a plurality of films.

Further, methods for layering the second substrate 20 and the third substrate 30 are not limited to Cu—Cu metallic bonding and covalent bonding of silicon oxide films, and the second substrate 20 and the third substrate 30 can be layered by bonding insulation films together.

Further, after the second substrate 20 and the third substrate 30 are layered, the first semiconductor member 11 is formed into a thin film. Thereafter, an optical structure, such as an in-layer lens, a color filter layer, and a microlens, can be formed on the first surface 140.

As described above, the photoelectric conversion elements PD of the photoelectric conversion apparatus 1 according to the present exemplary embodiment include the n-type semiconductor regions 110, and the pixel transistors of the reading circuits 22 of the photoelectric conversion apparatus 1 according to the present exemplary embodiment are formed into a PMOS type. To form MOS transistors of a different conductivity type from each other on a substrate, physical space for electrically isolating well regions of the transistors of each conductivity type are needed, making it difficult for miniaturization.

On the other hand, in the structure illustrated in FIG. 5, the pixels 12 and the pixel transistors of the reading circuits 22 are formed on different substrates that are physically separated from each other. Thus, the structure eliminates the need to secure space for isolating the well regions of the two elements (the pixels 12 and the pixel transistors). Specifically, when the photoelectric conversion elements PD are formed into electron storage type photodiodes, a decrease in layout efficiency is less likely to occur even if the pixel transistors are formed into a PMOS type as compared with the case of a NMOS type.

Furthermore, to form MOS transistors having a different conductivity type from each other on a substrate, mask switching is necessary in forming the MOS transistors. On the other hand, when MOS transistors of a single conductivity type are formed on each substrate and then the substrates are layered, mask switching is unnecessary in forming the MOS transistors.

Thus, according to the present exemplary embodiment, electron storage type photoelectric conversion elements are formed in a first substrate, and amplification transistors are formed into a PMOS type in a second substrate. This makes it possible to provide a photoelectric conversion apparatus that drives at high speed, effectively reduces 1/f noise in pixels, and is suitable for miniaturization.

Figure 12:
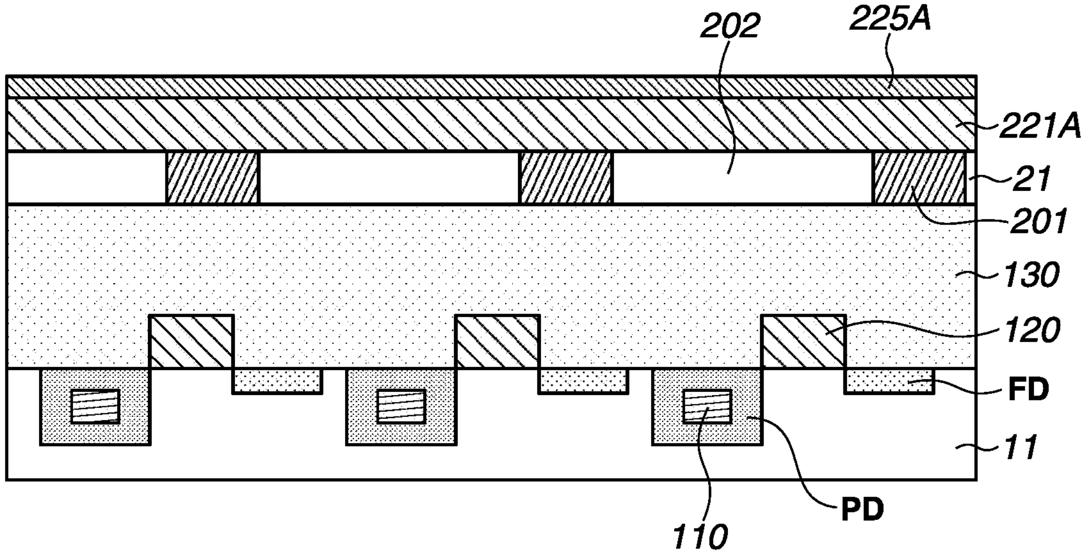
FIG. 12 is a cross-sectional view illustrating a method for fabricating a photoelectric conversion apparatus according to a second exemplary embodiment.
Figure 13:
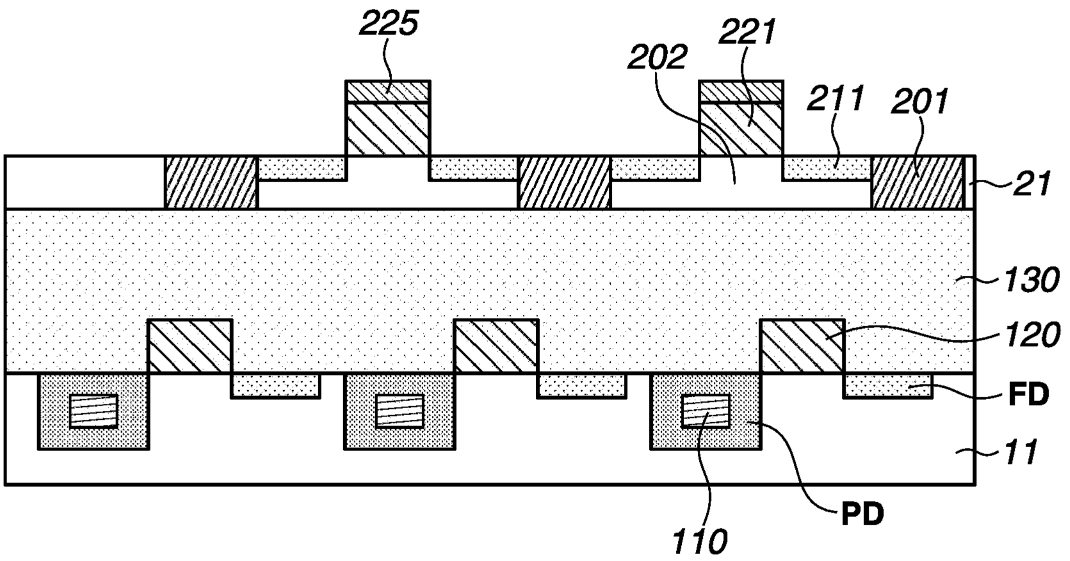
FIG. 13 is a cross-sectional view illustrating a method for fabricating a photoelectric conversion apparatus according to the second exemplary embodiment.

A structure of the photoelectric conversion apparatus 1 according to a second exemplary embodiment of the disclosure will be described with reference to FIGS. 12 and 13. FIGS. 12 and 13 are examples of cross-sectional views illustrating processes illustrating a method for fabricating the photoelectric conversion apparatus 1 according to the present exemplary embodiment. Each component corresponding to a component according to the first exemplary embodiment is given the same reference numeral as the corresponding component, and redundant descriptions thereof will be sometimes omitted or simplified.

The present exemplary embodiment is different from the first exemplary embodiment in conductivity type of PMOS gates. In the above-described example according to the first exemplary embodiment, the gates of the pixel transistors of the reading circuits 22 are formed of p-type polysilicon. The following is a description of an example where the gates of the pixel transistors are formed of n-type polysilicon according to the present exemplary embodiment. FIG. 1 illustrating a schematic structure of the photoelectric conversion apparatus 1 according to the present exemplary embodiment, FIGS. 2 to 4 illustrating examples of the pixels 12 and the reading circuits 22, and FIGS. 5 to 7 illustrating schematic cross-sections are similar to those according to the first exemplary embodiment.

A method for fabricating the photoelectric conversion apparatus 1 will be described in which the gates of the pixel transistors of the reading circuits 22 are formed of n-type polysilicon according to the present exemplary embodiment. Processes up to the layering of the second semiconductor member 21 are similar to those according to the first exemplary embodiment, so that redundant descriptions thereof will be omitted.

As illustrated in FIG. 12, the element isolation regions 201 and the first well regions 202 are formed in the second semiconductor member 21. Each first well region 202 includes an n-type semiconductor region. Thereafter, a second polysilicon layer 221A is formed of n-type polysilicon over the second semiconductor member 21. The n-type polysilicon can be formed by, for example, introducing a dopant gas during film formation using a low-pressure CVD method. Further, the n-type polysilicon can be formed also by implanting an n-type impurity using an ion implantation method after a polysilicon film is formed. Next, a hard mask layer 225A is formed over the second polysilicon layer 221A. The hard mask layer 225A functions as a mask in gate patterning.

Next, as illustrated in FIG. 13, second gates 221 and hard mask layers 225 on the second gates 221 are formed using a photolithography technique and an etching technique.

Thereafter, the p-type first source/drain regions 211 are formed using an ion implantation technique. At this time, the hard mask layers 225 function as a mask in source/drain implantation to prevent implantation of p-type impurities in the second gates 221. This makes it possible to form p-type transistors with low-resistance n-type polysilicon gates. At this time, the p-type impurity concentration in ion implantation performed to form the p-type first source/drain regions 211 is set smaller than the n-type impurity concentration of the second gates 221. This makes it possible to form p-type transistors including n-type gates without using the hard mask layers 225.

Thus, according to the present exemplary embodiment, electron storage type photoelectric conversion elements are formed in a first substrate, and amplification transistors are formed into a PMOS type in a second substrate. This makes it possible to provide a photoelectric conversion apparatus that drives at high speed, effectively reduces 1/f noise of pixels, and is suitable for miniaturization.

A conductivity type of polysilicon of a gate can be a parameter for determining a threshold voltage for a MOS transistor including the gate based on a difference in work function from a semiconductor substrate facing via an insulation film. Appropriately setting a conductivity type of polysilicon of a gate of a pixel transistor of the reading circuits 22 allows effective control of the threshold voltage even under a condition where a voltage to be applied to the gate has a limited range.

A structure of the photoelectric conversion apparatus 1 according to a third exemplary embodiment of the disclosure will be described with reference to FIGS. 14 to 18. Each component corresponding to a component according to the first or second exemplary embodiment is given the same reference numeral as the corresponding component, and redundant descriptions thereof will be sometimes omitted or simplified.

The present exemplary embodiment is different from the first and second exemplary embodiments in conductivity type of the pixel transistors. In the above-described examples according to the first and second exemplary embodiments, all the pixel transistors are formed into a PMOS type. In the present exemplary embodiment, an example will be described where each pixel transistor includes MOS transistors of two different conductivity types, NMOS and PMOS. FIG. 1 illustrating a schematic structure of the photoelectric conversion apparatus 1 and FIGS. 5 to 7 illustrating schematic cross-sections are similar to those according to the first and second exemplary embodiments. However, the unit pixels 25 have a different circuit structure from the circuit structures according to the first and second exemplary embodiments.

Figure 14:
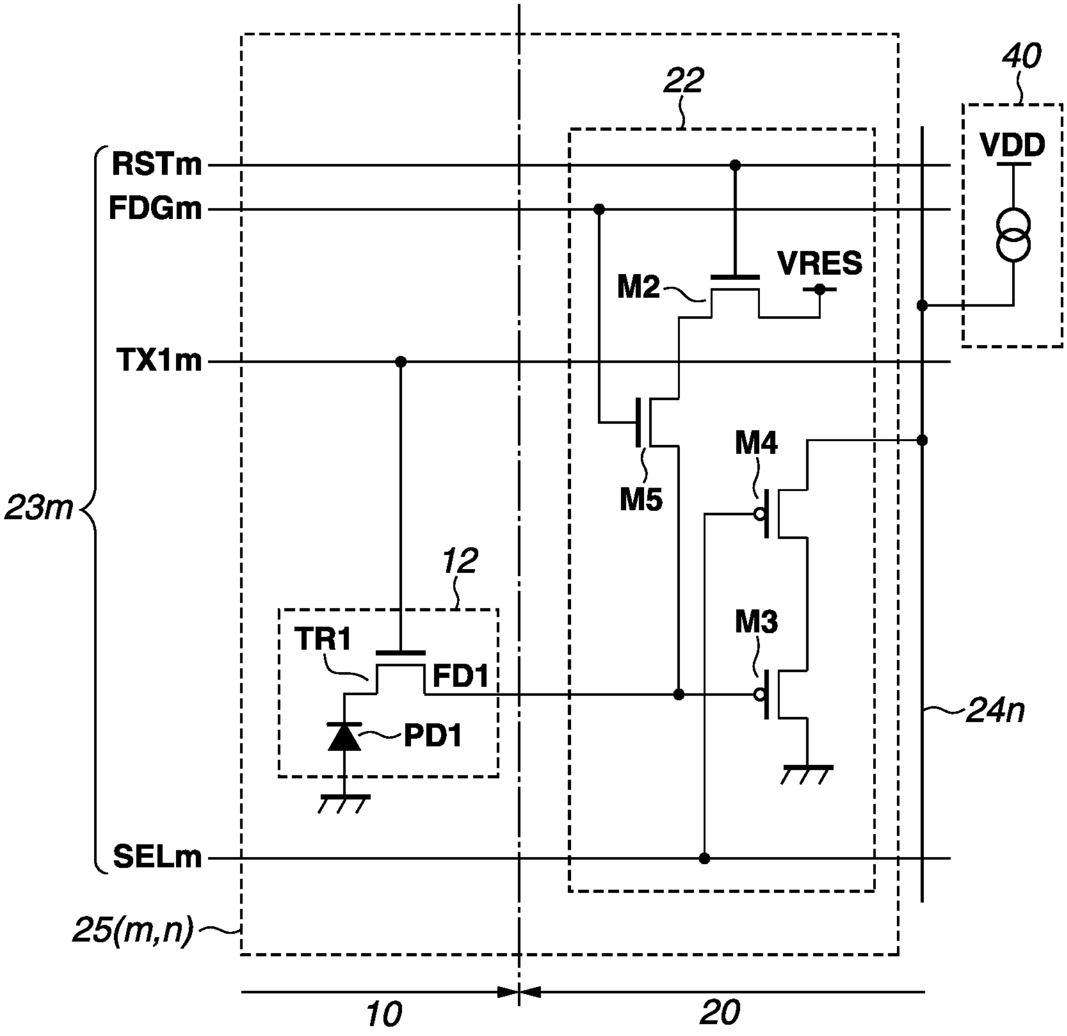
FIG. 14 is a circuit diagram illustrating a photoelectric conversion apparatus according to a third exemplary embodiment.
Figure 15:
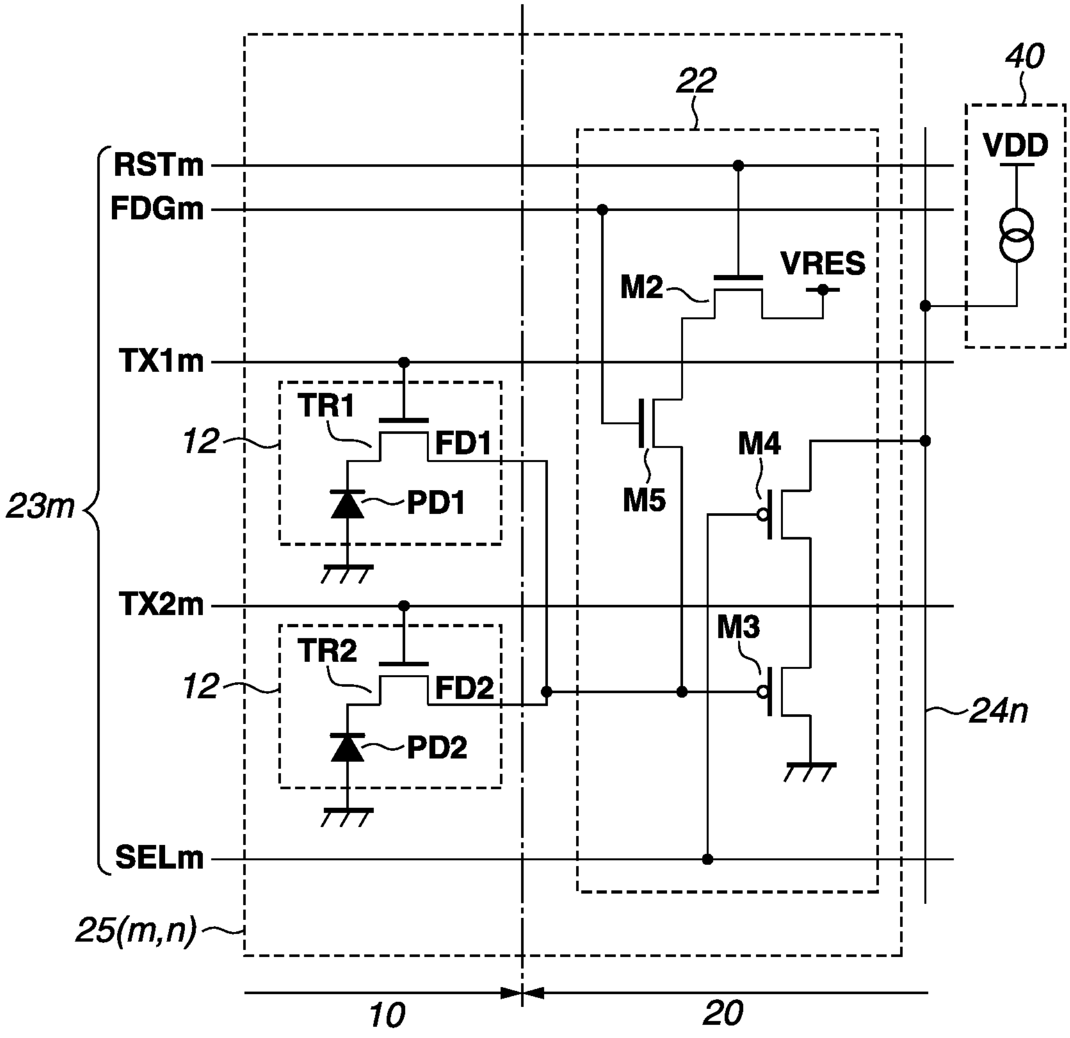
FIG. 15 is a circuit diagram illustrating a photoelectric conversion apparatus according to the third exemplary embodiment.
Figure 16:
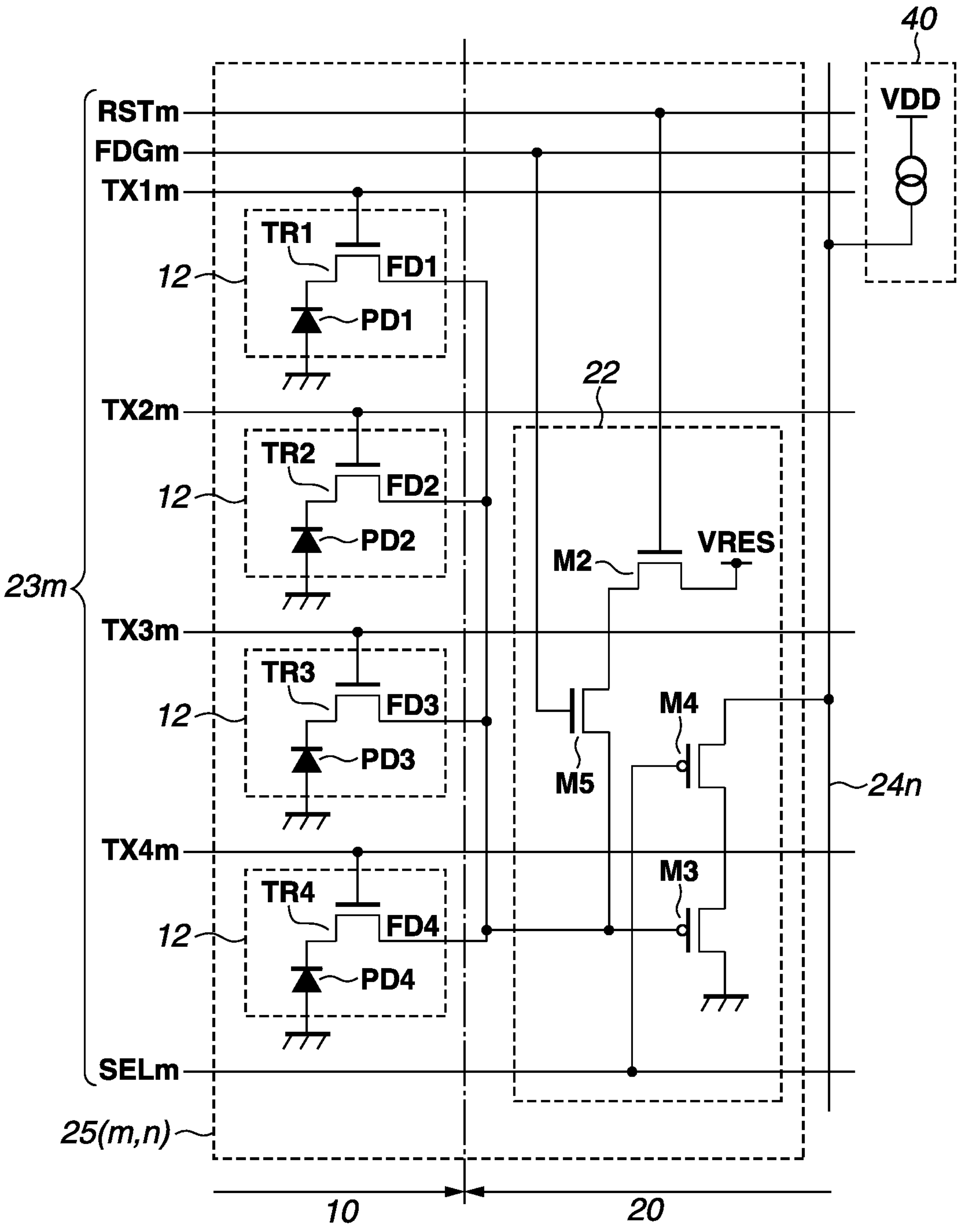
FIG. 16 is a circuit diagram illustrating a photoelectric conversion apparatus according to the third exemplary embodiment.

FIGS. 14 to 16 are examples of circuit diagrams illustrating the pixels 12 and the reading circuits 22 according to the present exemplary embodiment. The following is a description of a case where, out of the MOS transistors of the reading circuits 22, the reset transistor M2 and the FD capacitance switching transistor M5 are formed into a NMOS type, and the amplification transistor M3 and the selection transistor M4 are formed into a PMOS type, as an example. In this example, the reset transistor M2 and the FD capacitance switching transistor M5 can be formed into the same conductivity type as the conductivity type of the transfer transistors TR of the pixels 12. Furthermore, PMOS that is effective for reducing 1/f noise and RTS noise can be applied to the amplification transistor M3. Thus, the structure can be effective for miniaturization and reduction of noise in the reading circuits 22.

Combinations of conductivity types of the pixel transistors of the reading circuits 22 are not limited to the examples described herein.

Further, FIG. 14 is a circuit diagram illustrating a case where one pixel 12 corresponds to one reading circuit 22. According to the present exemplary embodiment, the number of pixels 12 to be connected to one reading circuit 22 can be changed to any number. More specifically, a case where two pixels 12 share one reading circuit 22 is illustrated in FIG. 15, and a case where four pixels 12 share one reading circuit 22 is illustrated in FIG. 16. The term "share" herein indicates that outputs of the plurality of pixels 12 are input to the reading circuit 22 shared by the plurality of pixels 12.

The pixels 12 illustrated in FIGS. 14 to 16 include common components. Thus, in order to distinguish between the common components of the pixels 12, an identification number (1, 2, 3, 4) is added at each end of reference numbers of the components of the pixels 12.

Figure 17:
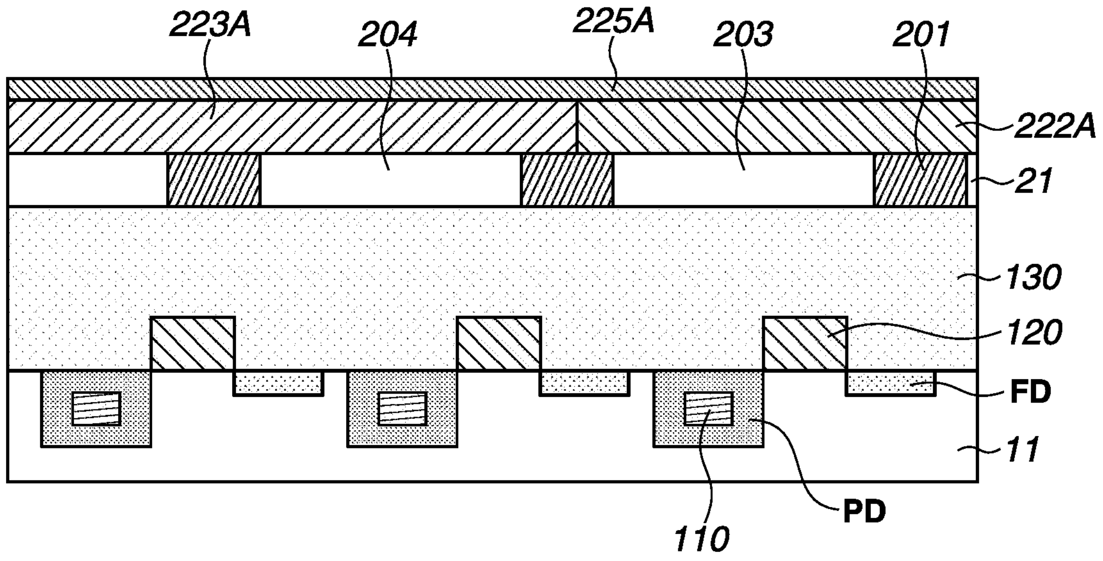
FIG. 17 is a cross-sectional view illustrating a method for fabricating a photoelectric conversion apparatus according to the third exemplary embodiment.
Figure 18:
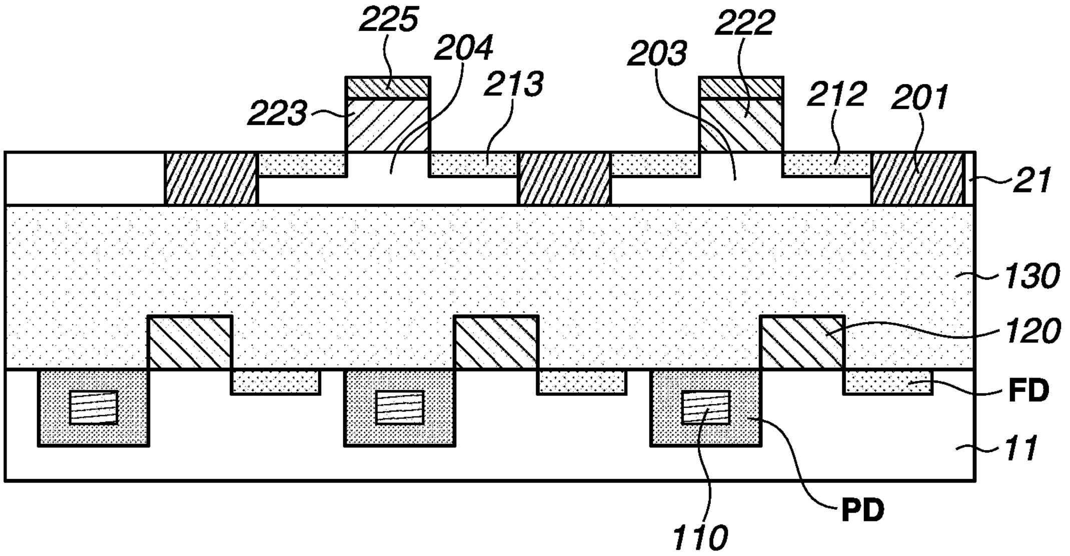
FIG. 18 is a cross-sectional view illustrating a method for fabricating a photoelectric conversion apparatus according to the third exemplary embodiment.

A method will now be described for fabricating the photoelectric conversion apparatus 1 including the reading circuits 22 including MOS transistors of two different conductivity types, NMOS and PMOS, according to the present exemplary embodiment. FIGS. 17 and 18 are examples of cross-sectional views illustrating the method for fabricating the photoelectric conversion apparatus 1 according to the present exemplary embodiment. Processes up to the layering of the second semiconductor member 21 are similar to those according to the first exemplary embodiment, so that redundant descriptions thereof will be omitted.

As illustrated in FIG. 17, the element isolation regions 201, second well regions 203, and third well regions 204 are formed in the second semiconductor member 21. The second well regions 203 and the third well regions 204 include semiconductor regions having a different polarity from each other. Further, a third polysilicon layer 222A and a fourth polysilicon layer 223A each can be a polysilicon layer having a conductivity type. Polysilicon can be formed using, for example, a low-pressure CVD method. Each of n- and p-type polysilicon layers can be formed by implanting an impurity in target regions using an ion implantation method using a photolithography technique after the polysilicon films are formed. Next, the hard mask layer 225A is formed over the third polysilicon layer 222A and the fourth polysilicon layer 223A. The hard mask layer 225A functions as a mask in gate patterning.

Next, as illustrated in FIG. 18, a third gate 222 and a fourth gate 223 are formed using a photolithography technique and an etching technique, and the hard mask layer 225 is formed on the third gate 222 and the fourth gate 223 using a photolithography technique and an etching technique. Thereafter, second source/drain regions 212 having a different polarity from the polarity of the second well region 203 are formed using an ion implantation technique. Further, third source/drain regions 213 having a different polarity from the polarity of the third well region 204 are formed similarly. At this time, the hard mask layer 225 functions as a mask in source/drain implantation to prevent implantation of impurities having a different polarity from the polarity of the third gate 222 and the fourth gate 223. This makes it possible to form transistors with low-resistance polysilicon gates. At this time, the impurity concentration in ion implantation performed to form the second source/drain regions 212 of a conductivity type is set lower than the concentrations of impurities having a different conductivity type from the conductivity type of the second source/drain regions 212 in the third gate 222. This makes it possible to form transistors including gates having a polarity without using the hard mask layer 225.

In a possible structure in the case according to the present exemplary embodiment, for example, the gates of the reset transistor M2 and the FD capacitance switching transistor M5 formed into a NMOS type are formed of n-type polysilicon, and the gates of the amplification transistor M3 and the selection transistor M4 formed into a PMOS type are formed of p-type polysilicon.

The processes thereafter are similar to those according to the first exemplary embodiment, so that redundant descriptions thereof will be omitted.

Thus, according to the present exemplary embodiment, electron storage type photoelectric conversion elements are formed in a first substrate, and amplification transistors are formed into a PMOS type in a second substrate. This makes it possible to provide a photoelectric conversion apparatus that drives at high speed, effectively reduces 1/f noise of pixels, and is suitable for miniaturization.

Figure 19A:
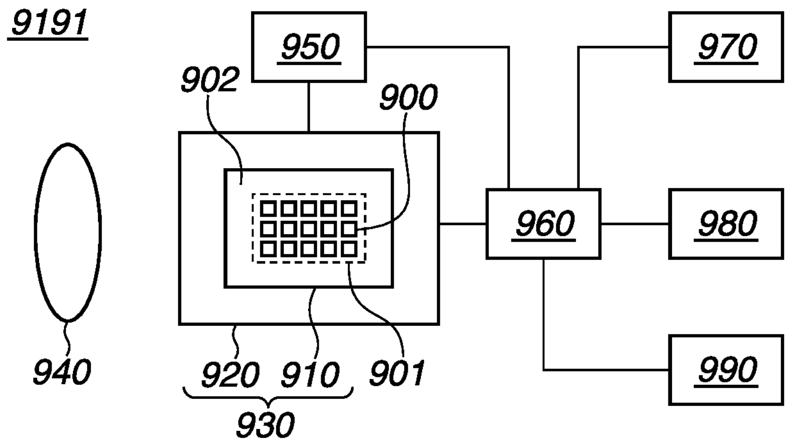
FIGS. 19A to 19C are schematic diagrams illustrating equipment according to a fourth exemplary embodiment.

A fourth exemplary embodiment will be described. The fourth exemplary embodiment is applicable to any one of the first to third exemplary embodiments. FIG. 19A is a schematic diagram illustrating equipment 9191 including a semiconductor apparatus 930 according to the present exemplary embodiment. The semiconductor apparatus 930 can use a photoelectric conversion apparatus according to any of the exemplary embodiments described above. The equipment 9191 including the semiconductor apparatus 930 will now be described in detail. The semiconductor apparatus 111 can include a semiconductor device 910. The semiconductor device 910 has a pixel area 901 in which pixel circuits 900 including photoelectric conversion units are arranged in a matrix. The semiconductor device 910 can have a peripheral area 902 around the pixel area 901. Circuits other than the pixel circuits 900 can be arranged in the peripheral area 902. The semiconductor apparatus 930 includes a semiconductor device 910 and can include a package 920 for storing the semiconductor device 910. The package 920 can include a base member and a cover member, such as glass. The semiconductor device 910 is fixed to the base member, and the cover member faces the semiconductor device 910. The package 920 can further include bonding members, such as bonding wires and bumps for connecting terminals provided on the base member and terminals provided on the semiconductor device 910 to each other.

The equipment 9191 can include at least one of an optical apparatus 940, a control apparatus 950, a processing apparatus 960, a display apparatus 970, a storage apparatus 980, or a mechanical apparatus 990. The optical apparatus 940 corresponds to the semiconductor apparatus 930. The optical apparatus 940 is, for example, a lens, a shutter, and/or a mirror and includes an optical system for guiding light to the semiconductor apparatus 930. The control apparatus 950 controls the semiconductor apparatus 930. The control apparatus 950 is, for example, a semiconductor apparatus, such as an application-specific integrated circuit (ASIC).

The processing apparatus 960 processes signals output from the semiconductor apparatus 930. The processing apparatus 960 is a semiconductor apparatus, such as a central processing unit (CPU) or an ASIC for forming an analog front-end (AFE) or a digital front-end (DFE). The display apparatus 970 is an electroluminescent (EL) display apparatus or a liquid crystal display apparatus for displaying information (image) acquired by the semiconductor apparatus 930. The storage apparatus 980 is a magnetic device or a semiconductor device for storing information (image) acquired by the semiconductor apparatus 930. The storage apparatus 980 is a volatile memory, such as a static random access memory (SRAM) or a dynamic random access memory (DRAM), or a non-volatile memory, such as a flash memory or a hard disk drive.

The mechanical apparatus 990 includes a moving unit or a propulsion unit, such as a motor and an engine. The equipment 9191 displays signals output from the semiconductor apparatus 930 on the display apparatus 970 and/or transmits signals output from the semiconductor apparatus 930 to the outside via a communication apparatus (not illustrated) of the equipment 9191. Thus, in one embodiment, the equipment 9191 further includes the storage apparatus 980 and the processing apparatus 960 separately from a storage circuit and a calculation circuit of the semiconductor apparatus 930. The mechanical apparatus 990 can be controlled based on signals output from the semiconductor apparatus 930.

Further, the equipment 9191 is suitable for electronic equipment, such as information terminals having an imaging function (e.g., smartphones, wearable terminals) and cameras (e.g., interchangeable-lens cameras, compact cameras, video cameras, monitoring cameras). The mechanical apparatus 990 of a camera can drive components of the optical apparatus 940 for zooming, focusing, and shutter operations. Further, the mechanical apparatus 990 of a camera can move the semiconductor apparatus 930 for anti-vibration operations.

Further, the equipment 9191 can be transportation equipment, such as a vehicle, a ship, or an aircraft. The mechanical apparatus 990 of transportation equipment can be used as a moving apparatus. The equipment 9191 as transportation equipment is suitable for use as transportation equipment that transports the semiconductor apparatus 930 or transportation equipment that assists in or automates driving (controlling) using an imaging function. The processing apparatus 960 for assisting in and/or automating driving (controlling) can perform processing for operating the mechanical apparatus 990 as a moving apparatus based on information acquired by the semiconductor apparatus 930. Further, the equipment 9191 can be medical equipment, such as an endoscope, measurement equipment, such as a distance measurement sensor, analysis equipment, such as an electron microscope, office equipment, such as a copy machine, or industrial equipment, such as a robot.

With any of the above-described exemplary embodiments, suitable pixel characteristics are provided, enhancing the value of the semiconductor apparatus 930. The enhancement of value herein corresponds to at least one of addition of a function, improvement in performance, improvement in characteristics, improvement in reliability, improvement in fabrication yield, environmental load reduction, cost reduction, size reduction, or weight reduction.

Thus, the use of the semiconductor apparatus 930 according to the present exemplary embodiment in the equipment 9191 also enhances the value of the equipment 9191. For example, the semiconductor apparatus 930 can be mounted on transportation equipment, providing excellent performance in imaging an area outside the transportation equipment and in measuring an environment outside the transportation equipment. Thus, determining to mount the semiconductor apparatus 930 according to the present exemplary embodiment to transportation equipment in fabricating/selling the transportation equipment is beneficial in enhancing performance of the transportation equipment. The semiconductor apparatus 930 is especially suitable for use in transportation equipment that assists in driving and/or performs automated driving using information acquired by a semiconductor apparatus.

Further, a photoelectric conversion system and a moving object according to the present exemplary embodiment will be described with reference to FIGS. 19B and 19C.

Figure 19B:
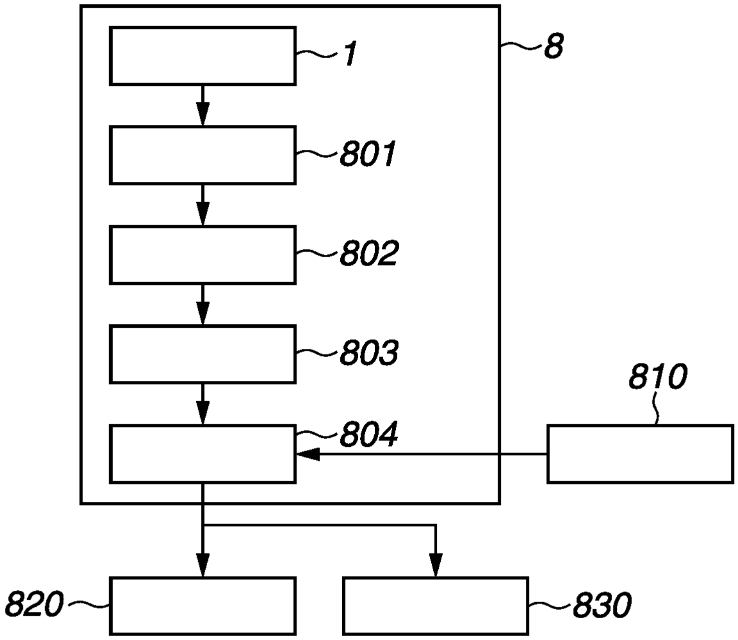

FIG. 19B illustrates an example of a photoelectric conversion system relating to an in-vehicle camera. A photoelectric conversion system 8 includes the photoelectric conversion apparatus 1. The photoelectric conversion apparatus 1 is the photoelectric conversion apparatus (imaging apparatus) according to one of the exemplary embodiments described above. The photoelectric conversion system 8 includes an image processing unit 801 and a parallax acquisition unit 802. The image processing unit 801 performs image processing on a plurality of pieces of image data acquired by the photoelectric conversion apparatus 1. The parallax acquisition unit 802 calculates a parallax (phase difference between parallax images) from the plurality of pieces of image data acquired by the photoelectric conversion system 8. Further, the photoelectric conversion system 8 includes a distance acquisition unit 803 and a collision determination unit 804. The distance acquisition unit 803 calculates a distance to a target object based on the calculated parallax. The collision determination unit 804 determines whether there is a possibility of a collision based on the calculated distance. The parallax acquisition unit 802 and the distance acquisition unit 803 are an example of a distance information acquisition unit for acquiring distance information to a target object. Specifically, the distance information is information about a parallax, a defocus amount, and a distance to a target object. The collision determination unit 804 can determine a possibility of a collision using one of the types of distance information. The distance information acquisition unit can be configured with dedicated hardware or software modules. Further, the distance information acquisition unit can be configured with a field programmable gate array (FPGA) or an ASIC or a combination thereof.

The photoelectric conversion system 8 is connected to a vehicle information acquisition apparatus 810 and can acquire vehicle information, such as vehicle velocity, yaw rate, and rudder angle. Further, a control engine control unit (control ECU) 820 is connected to the photoelectric conversion system 8. The control ECU 820 is a control apparatus that outputs control signals for generating braking force against a vehicle based on a determination result by the collision determination unit 804. Further, the photoelectric conversion system 8 is also connected to a warning apparatus 830. The warning apparatus 830 issues a warning to a driver based on a determination result by the collision determination unit 804. For example, if the collision determination unit 804 determines that there is a high possibility of a collision, the control ECU 820 performs vehicle control to avoid collision or to reduce damage by applying a brake, releasing an accelerator, and/or reducing engine output. The warning apparatus 830 issues a warning to a user by sounding a warning, such as a sound, displaying warning information on a screen of a car navigation system, and/or vibrating a seat belt or steering.

According to the present exemplary embodiment, the photoelectric conversion system 8 images an area near the vehicle, e.g., an area in front of the vehicle or an area behind the vehicle.

Figure 19C:
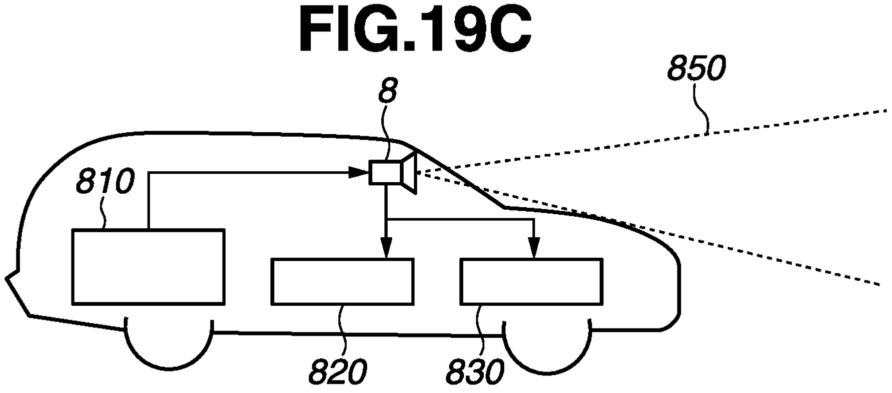

FIG. 19C illustrates a case where a photoelectric conversion system images an area (imaging range 850) in front of a vehicle. The vehicle information acquisition apparatus 810 transmits instructions to the photoelectric conversion system 8 or the photoelectric conversion apparatus 1. This configuration further improves distance measurement accuracy.

While an example where the control is performed to avoid collision with another vehicle has been described above, applications to the control for automated driving following another vehicle or the control for automated driving without lane departure are also possible. Furthermore, the photoelectric conversion system 8 is applicable to moving bodies (moving apparatuses), such as ships, aircraft, or industrial robots, as well as vehicles, such as a one's own vehicle. Furthermore, the photoelectric conversion system 8 is applicable to equipment that widely uses object recognition, such as intelligent transport systems (ITS), as well as moving bodies.

The above-described exemplary embodiments can be changed as appropriate without departing from the technique concept. The disclosure of the present specification is not limited to what described in the present specification and encompasses everything that can be understood from the present specification and the drawings attached to the present specification. Further, the disclosure of the present specification encompasses the complement of the concept described in the present specification. Specifically, in a case where the present specification includes, for example, the description "A is greater than B", even if the description "A is not greater than B" is omitted, it is understood that the present specification discloses that "A is not greater than B", because the inclusion of the description "A is greater than B" is based on the premise that the case "A is not greater than B" is considered.

With the present disclosure, a photoelectric conversion apparatus having a pixel structure suitable for miniaturization is capable of driving at high speed and outputting high-quality signals with reduced 1/f noise in the pixels.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2022-104633, filed Jun. 29, 2022, which is hereby incorporated by reference herein in its entirety.

What is claimed is:

1. A photoelectric conversion apparatus comprising:

a first substrate including a photoelectric conversion element; and a second substrate including an amplification transistor and a selection transistor connected electrically to a source of the amplification transistor, the amplification transistor being configured to amplify electrons that are signal charges output from the photoelectric conversion element, wherein the photoelectric conversion element includes an n-type semiconductor region configured to store the electrons, wherein the amplification transistor and the selection transistor are each a p-type metal oxide semiconductor (p-type MOS) transistor, and wherein the second substrate includes a reset transistor and a floating diffusion (FD) capacitance switching transistor, and wherein the reset transistor and the FD capacitance switching transistor are each a p-type MOS transistor.

2. The photoelectric conversion apparatus according to claim 1, wherein the first substrate includes a transfer transistor configured to transfer the electrons to the amplification transistor, and wherein the transfer transistor is an n-type metal oxide semiconductor (n-type MOS) transistor.

3. The photoelectric conversion apparatus according to claim 1, wherein a gate of the amplification transistor is formed of p-type polysilicon.

4. The photoelectric conversion apparatus according to claim 1, wherein a gate of the amplification transistor is formed of n-type polysilicon.

5. The photoelectric conversion apparatus according to claim 1, wherein the second substrate includes another reset transistor and another floating diffusion (FD) capacitance switching transistor, and wherein the other reset transistor and the other FD capacitance switching transistor are each an n-type MOS transistor.

6. The photoelectric conversion apparatus according to claim 1, wherein the second substrate includes another reset transistor and another FD capacitance switching transistor, and wherein the other reset transistor and the other FD capacitance switching transistor are metal oxide semiconductor (MOS) transistors of a different conductivity type from each other.

7. The photoelectric conversion apparatus according to claim 1, wherein the second substrate is layered on the first substrate.

8. The photoelectric conversion apparatus according to claim 1, wherein the first substrate includes a first semiconductor member including the photoelectric conversion element and includes a first insulation film, wherein the second substrate includes a second semiconductor member including a source region of the amplification transistor and includes a second insulation film, and wherein the first semiconductor member, the first insulation film, the second semiconductor member, and the second insulation film are arranged in this order.

9. The photoelectric conversion apparatus according to claim 1, further comprising a third substrate including a logic circuit configured to process a pixel signal output from the amplification transistor.

10. The photoelectric conversion apparatus according to claim 1, wherein the second substrate includes another reset transistor, and a first power supply voltage supplied to the other reset transistor and a second power supply voltage supplied to the amplification transistor are different from each other.

11. The photoelectric conversion apparatus according to claim 1, wherein a first power supply voltage supplied to the reset transistor is greater than a reference voltage and smaller than a second power supply voltage supplied to the amplification transistor.

12. The photoelectric conversion apparatus according to claim 11, wherein a negative bias is applied to an anode of the photoelectric conversion element.

13. The photoelectric conversion apparatus according to claim 9, wherein the third substrate is layered on the second substrate.

14. The photoelectric conversion apparatus according to claim 1, wherein the first substrate includes a floating diffusion portion, and a wiring structure penetrating through a depth position of the second substrate is electrically connected to the floating diffusion portion.

15. The photoelectric conversion apparatus according to claim 14, wherein the wiring structure is electrically connected to a gate of the amplification transistor.

16. Equipment comprising the photoelectric conversion apparatus according to claims 1, the equipment further comprising at least one of:

an optical apparatus configured to guide light to the photoelectric conversion apparatus;

a control apparatus configured to control the photoelectric conversion apparatus;

a processing apparatus configured to process a signal output from the photoelectric conversion apparatus;

a display apparatus configured to display information acquired by the photoelectric conversion apparatus;

a storage apparatus configured to store information acquired by the photoelectric conversion apparatus; and a mechanical apparatus configured to operate based on information acquired by the photoelectric conversion apparatus.

17. A photoelectric conversion apparatus comprising:

a first substrate including a photoelectric conversion element; and a second substrate including an amplification transistor and a selection transistor connected electrically to a source of the amplification transistor, the amplification transistor being configured to amplify electrons that are signal charges output from the photoelectric conversion element, wherein the photoelectric conversion element includes an n-type semiconductor region configured to store the electrons, wherein the amplification transistor and the selection transistor are each a p-type metal oxide semiconductor (p-type MOS) transistor, and wherein a gate of the amplification transistor is formed of p-type polysilicon.

18. A photoelectric conversion apparatus comprising:

a first substrate including a photoelectric conversion element; and a second substrate including an amplification transistor and a selection transistor connected electrically to a source of the amplification transistor, the amplification transistor being configured to amplify electrons that are signal charges output from the photoelectric conversion element, wherein the photoelectric conversion element includes an n-type semiconductor region configured to store the electrons, wherein the amplification transistor and the selection transistor are each a p-type metal oxide semiconductor (p-type MOS) transistor, and wherein the second substrate includes a reset transistor, and a first power supply voltage supplied to the reset transistor is greater than a reference voltage and smaller than a second power supply voltage supplied to the amplification transistor.

* * * * *